US009756757B2

(12) United States Patent
Park et al.

(10) Patent No.: US 9,756,757 B2
(45) Date of Patent: Sep. 5, 2017

(54) FLEXIBLE DISPLAY APPARATUS

(71) Applicant: LG Display Co., Ltd., Seoul (KR)

(72) Inventors: Chang Yoon Park, Ansan-si (KR); Choun Sung Kang, Goyang-si (KR); Yong Seok Lee, Paju-si (KR); Sang Dae Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/981,653

(22) Filed: Dec. 28, 2015

(65) Prior Publication Data

US 2016/0374228 A1 Dec. 22, 2016

(30) Foreign Application Priority Data

Jun. 19, 2015 (KR) .................. 10-2015-0087794

(51) Int. Cl.
| | |
|---|---|
| H05K 7/00 | (2006.01) |
| H05K 7/16 | (2006.01) |
| G09F 9/30 | (2006.01) |
| G09F 15/00 | (2006.01) |
| H05K 5/00 | (2006.01) |
| H05K 7/14 | (2006.01) |

(52) U.S. Cl.
CPC .............. *H05K 7/16* (2013.01); *G09F 9/301* (2013.01); *G09F 15/0062* (2013.01); *H05K 5/0017* (2013.01); *H05K 7/1417* (2013.01)

(58) Field of Classification Search
CPC ...... H05K 7/16; H05K 5/0017; H05K 7/1417; G09F 9/301; G09F 15/0062

USPC ............................. 361/728–730, 748
See application file for complete search history.

(56) References Cited

U.S. PATENT DOCUMENTS

| | | | | |
|---|---|---|---|---|
| 1,669,052 | A * | 5/1928 | Gusman | G09F 11/29 160/24 |
| 6,873,458 | B1 * | 3/2005 | Bakkom | G03B 21/58 359/443 |
| D609,263 | S * | 2/2010 | Tatara | D16/241 |
| 8,023,283 | B2 * | 9/2011 | Cheng | H04M 1/04 361/801 |
| 2006/0279840 | A1 * | 12/2006 | Yamauchi | G03B 21/56 359/461 |
| 2007/0180745 | A1 | 8/2007 | Ofuji et al. | |
| 2010/0177020 | A1 | 7/2010 | Bemelmans et al. | |
| 2010/0246113 | A1 | 9/2010 | Visser et al. | |

(Continued)

FOREIGN PATENT DOCUMENTS

| | | |
|---|---|---|
| CN | 200983069 Y | 11/2007 |
| CN | 201194147 Y | 2/2009 |

(Continued)

*Primary Examiner* — Hung S Bui
(74) *Attorney, Agent, or Firm* — Birch, Stewart, Kolasch & Birch, LLP

(57) ABSTRACT

A flexible display apparatus has a small thickness which makes it easy to wind or unwind a flexible display module. The flexible display apparatus includes a frame module, into or from which a flexible display module is wound or unwound, and a panel elevating module configured to vertically move the flexible display module via folding or unfolding of at least one retractable unit. The retractable unit includes joint members provided at ends of first and second links intersecting each other, and elastic members installed to the respective joint members and supported by the ends of the first and second links.

22 Claims, 13 Drawing Sheets

(56) References Cited

U.S. PATENT DOCUMENTS

2014/0247544 A1     9/2014   Ryu
2016/0363960 A1*   12/2016   Park ..................... G06F 1/1656

FOREIGN PATENT DOCUMENTS

| CN | 103069473 A | 4/2013 |
|---|---|---|
| JP | 2009-21660 A | 1/2009 |
| JP | 2010-78684 A | 4/2010 |
| KR | 10-2012-0093665 A | 8/2012 |

\* cited by examiner

FLEXIBLE DISPLAY APPARATUS

CROSS REFERENCE TO RELATED APPLICATIONS

This application claims the benefit of the Korean Patent Application No. 10-2015-0087794 filed on Jun. 19, 2015, which is hereby incorporated by reference as if fully set forth herein.

BACKGROUND

Field of the Invention

The present invention relates to a flexible display apparatus and, more particularly, to a flexible display apparatus which makes it easy to wind or unwind a flexible display module.

Description of the Related Art

In general, display apparatuses using flat display panels such as, for example, liquid crystal display apparatuses, plasma display apparatuses, organic light emitting display apparatuses, electrophoretic display apparatuses, and electro wetting display apparatuses, are mainly applied to, for example, laptop computers, portable electronic appliances, televisions, or monitors.

Conventional flat display panels use inflexible glass substrates and are limited in their applicability and fields of use. Thus, flexible display apparatuses, which are bendable through the use of flexible substrates such as, for example, plastic substrates rather than inflexible glass substrates, have recently received attention as new display apparatuses. In particular, research and development into flexible display apparatuses which enable a flexible display panel to be wound up like a roll is actively underway.

For example, U.S. Patent Publication No. US 2014/0247544 discloses a roller type flexible apparatus.

In the roller type flexible apparatus, a flexible display unit is wound around a roll or unwound therefrom into a planar state inside a main body housing using a foldable rod assembly which includes a plurality of pairs of rotatable "X"-shaped rods.

However, the conventional roller type flexible apparatus has the following problems.

First, unwinding the flexible display unit requires a user to apply great pulling force because the flexible display unit is wound or unwound by a manual user operation.

Second, the use of the "X"-shaped rods having a variable length causes difficulty in realizing a slim design of the flexible apparatus due to the complicated and thick configuration of the rods.

Third, two main body housings are used to unwind the flexible display unit, which results in configuration complexity.

As a result, there is a demand for a roller type flexible apparatus which may provide easy winding or unwinding of a flexible display unit and may be applied to a large flexible display apparatus as well as a portable small flexible display apparatus.

SUMMARY

Therefore, the present invention has been made in view of the above problems, and it is one object of the present invention to provide a flexible display apparatus which has a small thickness and makes it easy to wind or unwind a flexible display module.

In addition, it is another object of the present invention to provide a flexible display apparatus which enables a flexible display module, which has been pulled outward, to be kept in a planar state.

In accordance with an aspect of the present invention, to accomplish the above and other objects, a flexible display apparatus includes a frame module, into or from which a flexible display module is wound or unwound, and a panel elevating module configured to vertically move the flexible display module via folding or unfolding of at least one retractable unit, wherein the retractable unit includes joint members provided at ends of first and second links intersecting each other and elastic members installed to the respective joint members and supported by the ends of the first and second links.

The elastic member may be compressed when the flexible display module is moved downward and may provide the respective first and second links with compressive restoration force when the flexible display module is moved upward.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
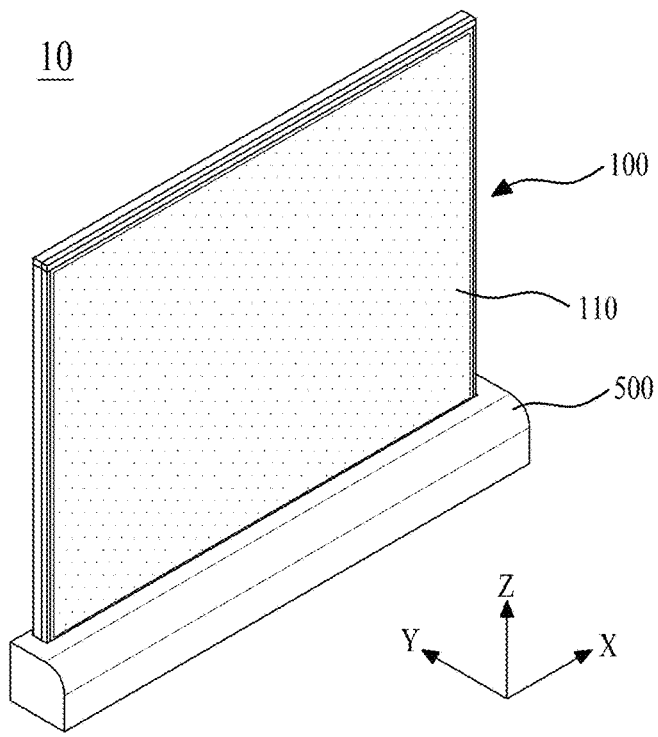
FIG. 1 is a view illustrating a flexible display module pulled outward from a housing cover in a flexible display apparatus according to one embodiment of the present invention.

The meanings of terms described in the present specification should be understood as follows.

The singular forms should be understood as including the plural forms as well unless the context clearly indicates otherwise. The terms "first", "second", and the like are used to discriminate any one element from other elements and the scope of the present invention is not intended to be limited by these terms. The terms "comprises" "includes" and the like should be understood as not precluding the presence or addition of one or more other features, integers, steps, operations, elements, components, or combinations thereof. The term "at least one" should be understood as including all combinations that may be suggested from one or more associated items. For example, the meanings of "at least one of a first item, a second item, and a third item" includes not only each of the first item, the second item, and the third item, but also all combinations of these items that may be suggested from two or more ones of the first item, the second item, and the third item. In addition, when any one element is referred to as being "on" another element, it can be directly on the upper surface of the other element or a third intervening element may also be present.

Hereinafter, exemplary embodiments of a flexible display apparatus according to the present invention will be described in detail with reference to the accompanying drawings. In the drawings, the same or similar elements are denoted by the same reference numerals even though they are depicted in different drawings. In addition, in the following description of the present invention, a detailed description of known functions and configurations incorporated herein will be omitted when it may make the subject matter of the present invention rather unclear.

Figure 2:
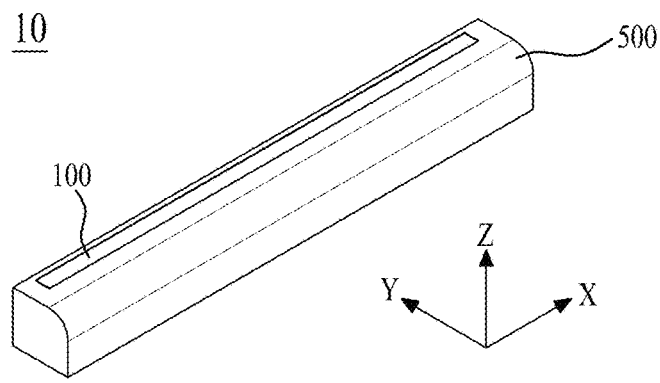
FIG. 2 is a view illustrating a flexible display module wound inside the housing cover in the flexible display apparatus according to one embodiment of the present invention.
Figure 3:
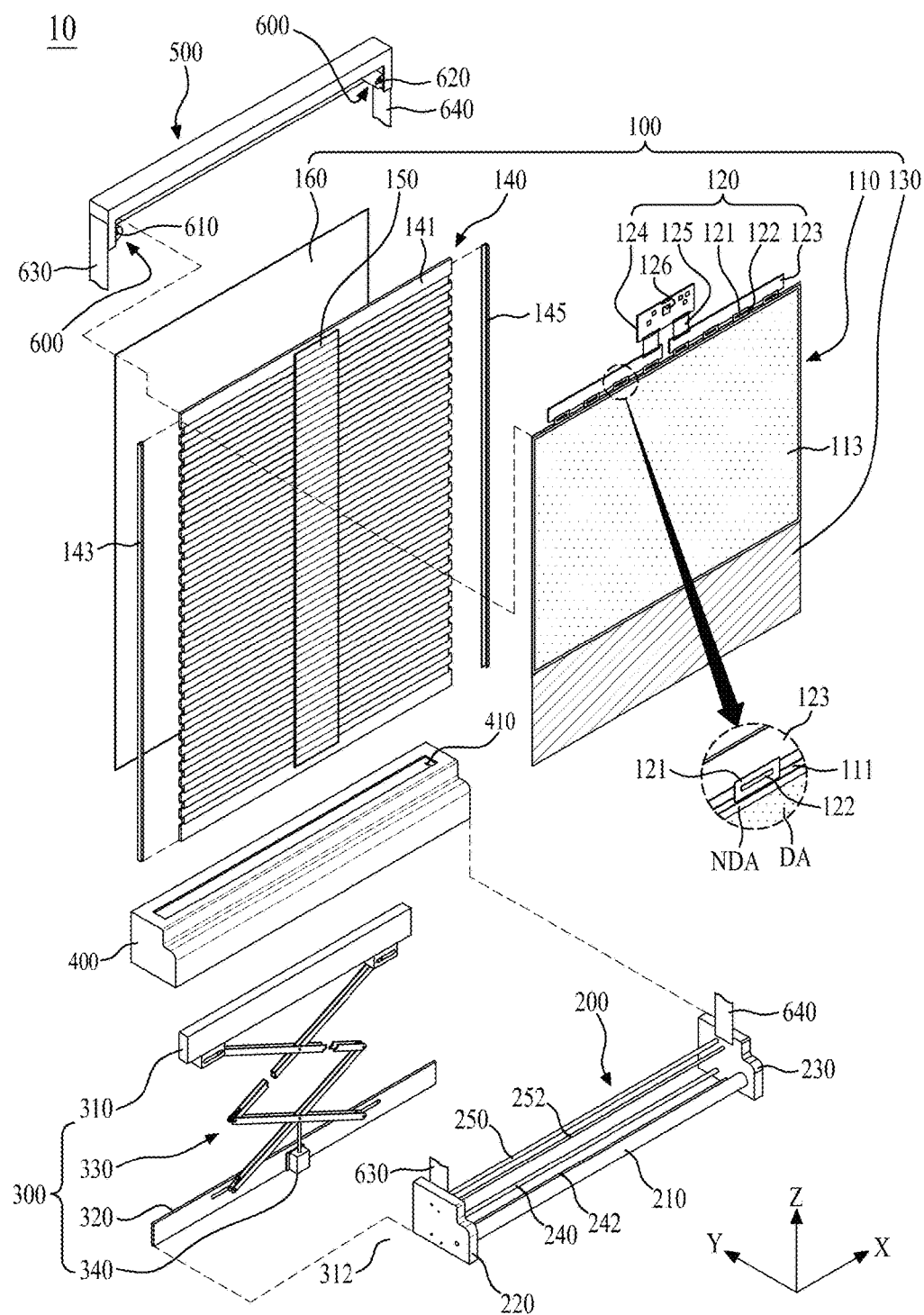
FIG. 3 is an exploded perspective view of the flexible display apparatus according to one embodiment of the present invention.

FIG. 1 is a view illustrating a flexible display module pulled outward from a housing cover in a flexible display apparatus according to one embodiment of the present invention, FIG. 2 is a view illustrating a flexible display module wound inside the housing cover in the flexible display apparatus according to one embodiment of the present invention, and FIG. 3 is an exploded perspective view of the flexible display apparatus according to one embodiment of the present invention.

Referring to FIGS. 1 to 3, the flexible display apparatus 10 according to one embodiment of the present invention includes a flexible display module 100, a frame module 200, a panel elevating module 300, and a cover housing 400.

The flexible display module 100 serves to display a still image, a moving image, or a stereoscopic image in the vertically upright state thereof. The flexible display module 100 may be wound to be received in the frame module 200 via the first direction driving of the panel elevating module 300, or may be unwound from the frame module 200 so as to stand vertically upright. The flexible display module 100 according to one embodiment may include a flexible display panel 110, a panel driving circuit unit 120, and a module connection member 130.

The flexible display panel 110 may be a flat display panel using a flexible substrate. For example, the flexible display panel 110 may be a flexible organic light emitting display panel, a flexible electrophoretic display panel, a flexible liquid crystal display panel, or a flexible electro wetting display panel.

The flexible display panel 110 may include a flexible substrate 111 and a front cover member 113.

The flexible substrate 111 may be a plastic substrate or a flexible glass substrate. Here, the plastic substrate may be formed of any one material selected from among polyimide (PI), polyethylene terephthalate (PET), polycarbonate (PC), polyethylene naphthalate (PEN), polynorbornene (PNB), polyether sulfone (PES), and cyclic olefin polymer (COP).

The flexible substrate 111 is a thin film transistor array substrate and includes a display area DA and a non-display area NDA surrounding the display area DA. The display area DA includes a pixel array (not illustrated) consisting of a plurality of pixels (not illustrated) formed at all intersections of a plurality of gate lines (not illustrated) and a plurality of data lines (not illustrated). The respective pixels include display elements which display an image corresponding to image signals. Here, the display elements may be organic light emitting elements, liquid crystal display elements, electrophoretic elements, or electro wetting display elements, for example.

The non-display area NDA at the longer side of the flexible substrate 111 is provided with a pad portion (not illustrated) connected to the pixel array. In addition, the non-display area NDA at the shorter side of the flexible substrate 111 is provided with a gate driving circuit (not illustrated) to supply gate signals to the gate lines. The gate driving circuit may be formed simultaneously with the fabrication of thin film transistors of the respective pixels so as to be connected to the respective gate lines.

The cover member 113 is configured to cover the front surface of the remaining flexible substrate 111, except for the upper non-display area NDA of the flexible substrate 111 provided with the pad portion. Here, in the case where the display elements are organic light emitting elements or electrophoretic elements, the front cover member 113 according to one embodiment may be a flexible encapsulation substrate or encapsulation layer. In the case where the display elements are liquid crystal display elements, electro wetting display elements, or electrophoretic elements, the front cover member 113 according to another embodiment may be a flexible color filter substrate including color filters corresponding to the pixels.

In addition, in the case where the flexible display panel 110 is a flexible organic light emitting display panel, although the flexible display panel 110 may further include an upper polarizer film (not illustrated) attached to the upper surface of the front cover member 113, the upper polarizer film may be omitted for the flexibility of the flexible display panel 110. In addition, a very thin metal plate may be attached to the rear surface of the flexible substrate 111. The metal plate may be formed of invar.

Meanwhile, the flexible display module 100 according to one embodiment of the present invention may further include a touchscreen (not illustrated) for a user interface using the user's touch. The touchscreen may be attached to the flexible display panel 110, may be mounted in the flexible display panel 110 in an in-cell touch manner simultaneously with the formation of the pixel array, or may be provided at the front cover member 113 via patterning.

The panel driving circuit unit 120 serves to drive the respective pixels of the pixel array provided at the flexible display panel 110 to display an image on the flexible display panel 110. The panel driving circuit unit 120 according to one embodiment may include a plurality of flexible circuit films 121, data driving integrated circuits 122, a printed circuit board 123, and a control board 124.

The respective flexible circuit films 121 are attached between the pad portion of the flexible substrate 111 and the printed circuit board 123 via a film attachment process. The flexible circuit films 121 may be Tape Carrier Packages (TCPs), Chip On Flexible Boards, or Chip On Films (COFs). The respective soft circuit films 121 may be bent to surround the upper surface of the flexible display panel 110 and disposed on the rear surface of a flexible rear cover 140.

The data driving integrated circuits 122 are mounted to the respective flexible circuit films 121 and connected to the pad portion using the flexible circuit films 121. The data driving integrated circuits 122 are adapted to receive pixel data on a per pixel basis and data control signals supplied from the control board 124 and to convert the pixel data on a per pixel basis into analog data signals based on the data control signals to thereby supply the data signals to the corresponding data lines through the pad portion.

The printed circuit board 123 is connected to the flexible circuit films 121. The printed circuit board 123 serves to supply drive power and signals, supplied from the control board 124, to the data driving integrated circuit 122 and the gate driving circuit, in order to display an image at the respective pixels. To this end, the printed circuit board 123 is provided with signal transmission lines and various power lines. One or more printed circuit boards 123 may be provided based on the number of the flexible circuit films 121 and disposed on the rear surface of the flexible rear cover 140.

The control board 124 may be connected to the printed circuit board 123 using signal cables 125 and disposed on the rear surface of the flexible rear cover 140. The control board 124 is provided with a timing controller 126, various power circuits (not illustrated), and a memory element (not illustrated), for example.

The timing controller 126 is mounted on the printed circuit board 123 to generate pixel data on a per pixel basis by aligning digital image data input from an external host system (not illustrated) to conform to the pixel arrangement structure of the flexible display panel 110 and to supply the generated pixel data on a per pixel basis to the data driving integrated circuit 122. In addition, the timing controller 126 generates a data control signal and a gate control signal based on a timing synchronization signal supplied from the host system to control the driving timing of each of the data driving integrated circuit 122 and the gate driving circuit.

The module connection member 130 is connected to the lower side of the flexible display panel 110 to thereby be connected to a panel roller 210 that is disposed inside the frame module 200. Here, the flexible display panel 110 is connected to the panel roller 210 to be wound thereon or unwound therefrom. The module connection member 130 is configured to connect the lower side of the vertically upright flexible display panel 110 and the panel roller 210 to each other to allow the display area DA of the vertically upright flexible display panel 110 to be pulled outward from the frame module 200, rather than being inserted in the frame module 200. In one embodiment, the module connection member 130 may be attached to a lower edge of the flexible substrate 111. In this case, the lower edge of the flexible substrate 111 may extend outward from the side surface of the front cover member 113 so as to be mechanically coupled to the module connection member 130. In another embodiment, the module connection member 130 may be attached to a lower edge of the front cover member 113. The module connection member 130 as described above may be formed of a flexible material and, for example, may be a metal sheet.

Meanwhile, the flexible display panel 110 may further include an extension (not illustrated) which extends, by a long length, from a lower non-display area of the flexible substrate 111 or a lower non-display area of the front cover member 113 so as to be coupled to the panel roller 210. In this case, although the module connection member 130 may be omitted, the flexible display panel 110 may be connected to the panel roller 210 using the module connection member 130 in consideration of the manufacturing process of the flexible display panel 110 and the assembly efficiency between the flexible display panel 110 and the panel roller 210.

In addition, the flexible display module 100 may further include the flexible rear cover 140 which is coupled to the upper side of the flexible display panel 110 to selectively support the rear surface of the flexible display panel 110.

The flexible rear cover 140 is configured to support the rear surface of the flexible display panel 110 pulled outward from the frame module 200 upon the unwinding of the flexible display module 100, thereby allowing the flexible display panel 110 to stand vertically upright from the ground. In addition, the flexible rear cover 140 is configured to be separated from the rear surface of the flexible display panel 110 that is being wound to thereby be inserted into the frame module 200, upon the winding of the flexible display module 100, thereby being separately received in the wound state inside the frame module 200. In this way, according to the present invention, the flexible rear cover 140 and the flexible display panel 110 are separately wound to be received in the frame module 200, which ensures easy winding of the flexible display panel 110.

The flexible rear cover 140 according to a first embodiment may be selectively attached to the rear surface of the flexible display panel 110 using a panel attachment member 150. For example, the flexible rear cover 140 according to the first embodiment includes a panel support unit 141, a first side surface protective cover 143, and a second side surface protective cover 145.

The panel support unit 141 is selectively attached to the rear surface of the flexible display panel 110 using the panel attachment member 150 so as to support the flexible display panel 110 in a bendable manner.

In one embodiment, the panel support unit 141 may include a plurality of support bars. The respective support bars are rotatably connected to one another to cover the rear surface of the flexible display panel 110. The support bars have the same length which is longer than the length of the flexible display panel 110 by a predetermined length, so as to protect the side surfaces of the flexible display panel 110 from external shock applied to the side surfaces. The respective support bars are individually rotated to correspond to the bending curvature of the flexible display panel 110 during the winding or unwinding of the flexible display panel 110, thereby guiding the flexible display panel 110 to be wound or to be unwound to stand vertically upright.

The first side surface protective cover 143 is configured to surround one side edge of the panel support unit 141, that is, the front surface, the side surface and the rear surface of one side edge portion of each of the support bars 141, thereby absorbing external shock applied to the side surface of each support bar 141. The first side surface protective cover 143 may be formed of an elastic material, for example, silicon or urethane.

The second side surface protective cover 145 is configured to surround the other side edge of the panel support unit 141, that is, the front surface, the side surface and the rear surface of the other side edge portion of each of the support bars 141, thereby absorbing external shock applied to the side surface of each support bar 141.

In addition, a shock absorbing member (not illustrated) may be attached to the panel support surface of the flexible rear cover 140 facing the rear surface of the flexible display panel 110. In one embodiment, the shock absorbing member may comprise a cushion material having excellent expansion and contraction properties. In this case, the shock absorbing member serves to prevent slippage between the flexible rear cover 140 and the flexible display panel 110 by providing a shock absorbing effect upon the winding or unwinding of the flexible display panel 110.

The panel attachment member 150 according to one embodiment is installed to the panel support surface of the flexible rear cover 140 so as to be selectively attached to the rear surface of the flexible display panel 110. For example, the panel attachment member 150 selectively attaches the remaining portion of the flexible rear cover 140, except for the upper side of the flexible rear cover 140, to the rear surface of the flexible display panel 110 using magnetic force. The panel attachment member 150 as described above is attached to the rear surface of the flexible display panel 110 pulled outward from the frame module 200 upon the unwinding of the flexible display module 100 and is separated from the rear surface of the flexible display panel 110 that is being wound to be inserted into the frame module 200 upon the winding of the flexible display module 100.

In one embodiment, the panel attachment member 150 may include a magnet array consisting of first magnets having a first polarity and second magnets having a second polarity opposite to the first polarity, which are alternately attached to the panel support surface of the flexible rear cover 140. The magnet array may be arranged at the central portion and/or both side edge portions of the panel support surface of the flexible rear cover 140. To improve the vertical flatness of the flexible display panel 110 and to prevent the distortion of the flexible display panel 110, the magnet array may be arranged at the central portion of the panel support surface of the rear cover 140. Here, in the case where the panel attachment member 150 is configured as the magnet array, a metal plate may be provided at the rear surface of the flexible display panel 110.

In addition, the magnet array may be inserted into magnet insertion grooves (not illustrated) formed in the respective support bars 141 of the flexible rear cover 140, which may result in a reduction in the thickness of the flexible display module 100.

The frame module 200 is connected to the lower side of the flexible display panel 110 to assist the winding or unwinding of the flexible display panel 110 according to the driving of the panel elevating module 300. In one embodiment, the frame module 200 includes the panel roller 210, and first and second support frames 220 and 230.

The first and second support frames 220 and 230 are installed in parallel with each other to have a predetermined distance therebetween. The first and second support frames 220 and 230 serve to support the panel elevating module 300 and to rotatably support both ends of the panel roller 210.

The panel roller 210 is rotatably installed between the first and second support frames 220 and 230 such that the flexible display panel 110 is wound around or unwound from the panel roller 210 via the driving of the panel elevating module 300.

In one embodiment, one end of the panel roller 210 is rotatably installed to the front side of the first support frame 220 and the other end of the panel roller 210 is rotatably installed to the front side of the second support frame 230. At this time, rolling bearings (not illustrated) may be interposed between the respective first and second support frames 220 and 230 and the panel roller 210. The panel roller 210 according to the embodiment is rotated in the first direction by pushing force applied by the winding driving of the panel elevating module 300 so as to enable the winding of the flexible display panel 110 and is rotated in the second direction opposite to the first direction by pulling force applied by the unwinding driving of the panel elevating module 300 so as to enable the unwinding of the flexible display panel 110.

Figure 4:
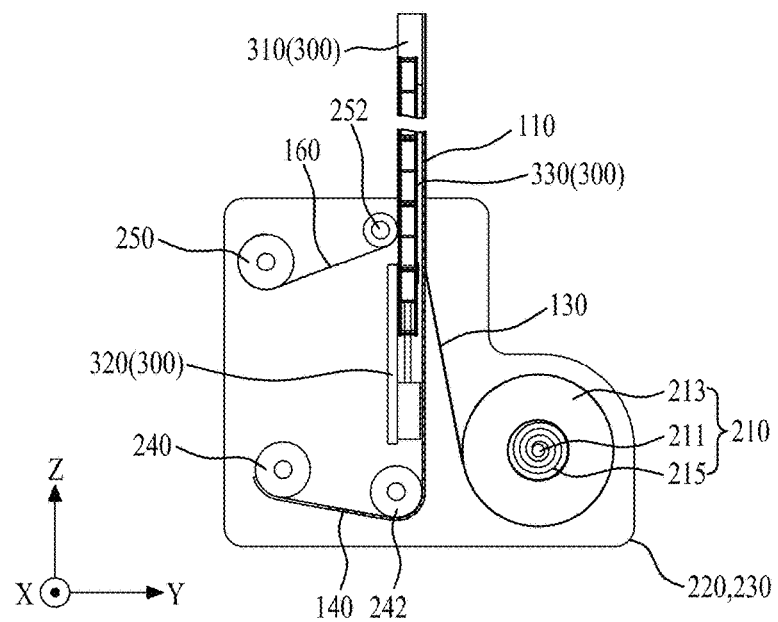
FIG. 4 is a sectional view illustrating the interior of a frame module according to the present invention.

In another embodiment, the panel roller 210, as exemplarily illustrated in FIG. 4, may include a fixing shaft 211 installed between the first and second support frames 220 and 230, a rolling member 213 rotatably supported around the fixing shaft 211, and a spiral spring 215 installed in a hollow region between the fixing shaft 211 and the roller member 213.

The spiral spring 215 is connected at one end thereof to the fixing shaft 211 and at the other end thereof to the inner surface of the rolling member 213. The spiral spring 215 as described above is compressed as the flexible display module 100 wound around the panel roller 210 is unwound, thereby providing the rolling member 213 with torque caused by compressive restoration force upon the winding of the flexible display module 100, which reduces load applied to the panel elevating module 300 upon the winding of the flexible display module 100. In this way, the flexible display panel 110 is wound around the panel roller 210 by pushing force generated by the unwinding driving of the panel elevating module 300 and torque caused by the compressive restoration force of the spiral spring 215.

In addition, the frame module 200 may further include a cover roller 240 connected between the first and second support frames 220 and 230 such that the flexible rear cover 140 is wound around or unwound from the cover roller 240.

In one embodiment, one end of the cover roller 240 is rotatably installed to the lower side of the first support frame 220 at a position adjacent to the panel roller 210 and the other end of the cover roller 240 is rotatably installed to the lower side of the second support frame 230 at a position adjacent to the panel roller 210. At this time, rolling bearings (not illustrated) may be interposed between the respective first and second support frames 220 and 230 and the cover roller 240. The cover roller 240 according to the embodiment as described above is rotated in the first direction by pushing force applied by the winding driving of the panel elevating module 300 so as to enable the winding of the flexible rear cover 140 and is rotated in the second direction by pulling force applied by the unwinding driving of the panel elevating module 300 so as to enable the unwinding of the flexible rear cover 140.

In another embodiment, the cover roller 240 is configured to be rotated by the compression and compressive restoration force of the spiral spring in the same manner as the panel roller 210 according to the above-described embodiment and, thus, a detailed description thereof will be omitted below.

The frame module 200 may further include a first guide roller 242 installed between the first and second support frames 220 and 230 at a position adjacent to the cover roller 240. The first guide roller 242 serves to maintain the constant tension of the flexible rear cover 140 as the flexible rear cover 140 is wound around or unwound from the cover roller 240.

Referring again to FIGS. 1 to 4, the panel elevating module 300 is adapted to vertically move the flexible display module 100 using the folding or unfolding of at least one retractable unit 330 to implement the winding or unwinding of the flexible display module 100, the retractable unit 330 being installed to the frame module 200 so as to support the upper side of the flexible display module 100. Specifically, the panel elevating unit 300 according to one embodiment may include an upper frame 310, a lower frame 320, the retractable unit 330, and a link elevating unit 340.

The upper frame 310 is coupled to the upper side of the flexible display module 100 so as to support the upper side of the retractable unit 330. That is, the upper frame 310 is coupled to the rear surface of the uppermost support bar 141 of the flexible rear cover 140 and serves to movably support the upper side of the retractable unit 330.

The lower frame 320 is connected between the first and second support frames 220 and 230 of the frame module 200 to support the link elevating unit 340. The lower frame 320 is coupled at one side edge portion thereof to the rear surface of the first support frame 220 and at the other side edge portion thereof to the rear surface of the second support frame 230.

The retractable unit 330 is installed to the frame module 200, that is, the upper frame 310 so as to support the upper side of the flexible display module 100 and is adapted to be folded or unfolded via the driving of the link elevating unit 340 to vertically move the flexible display module 100.

Figure 5:
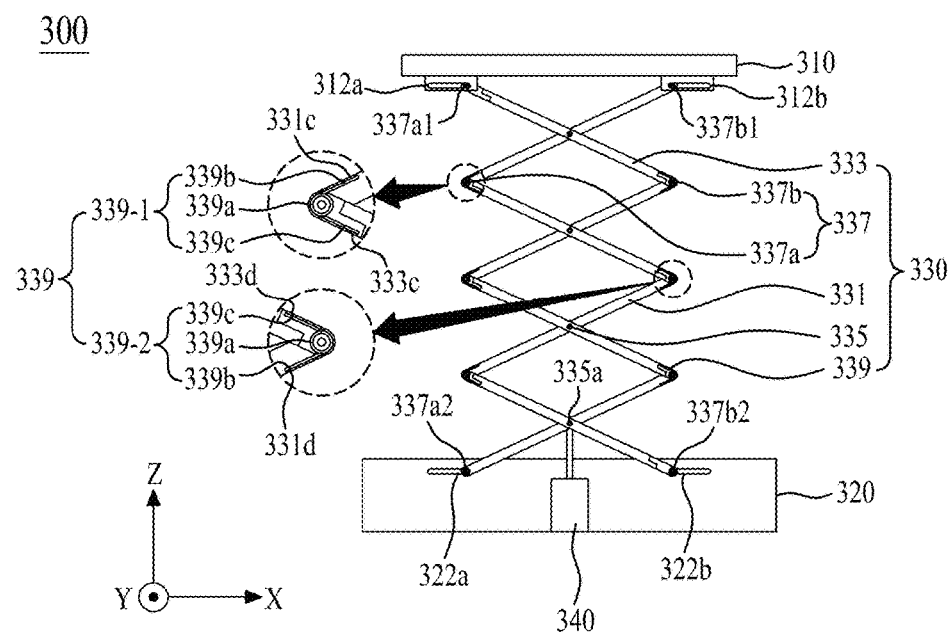
FIG. 5 is a view explaining a panel elevating module illustrated in FIG. 3.
Figure 6:
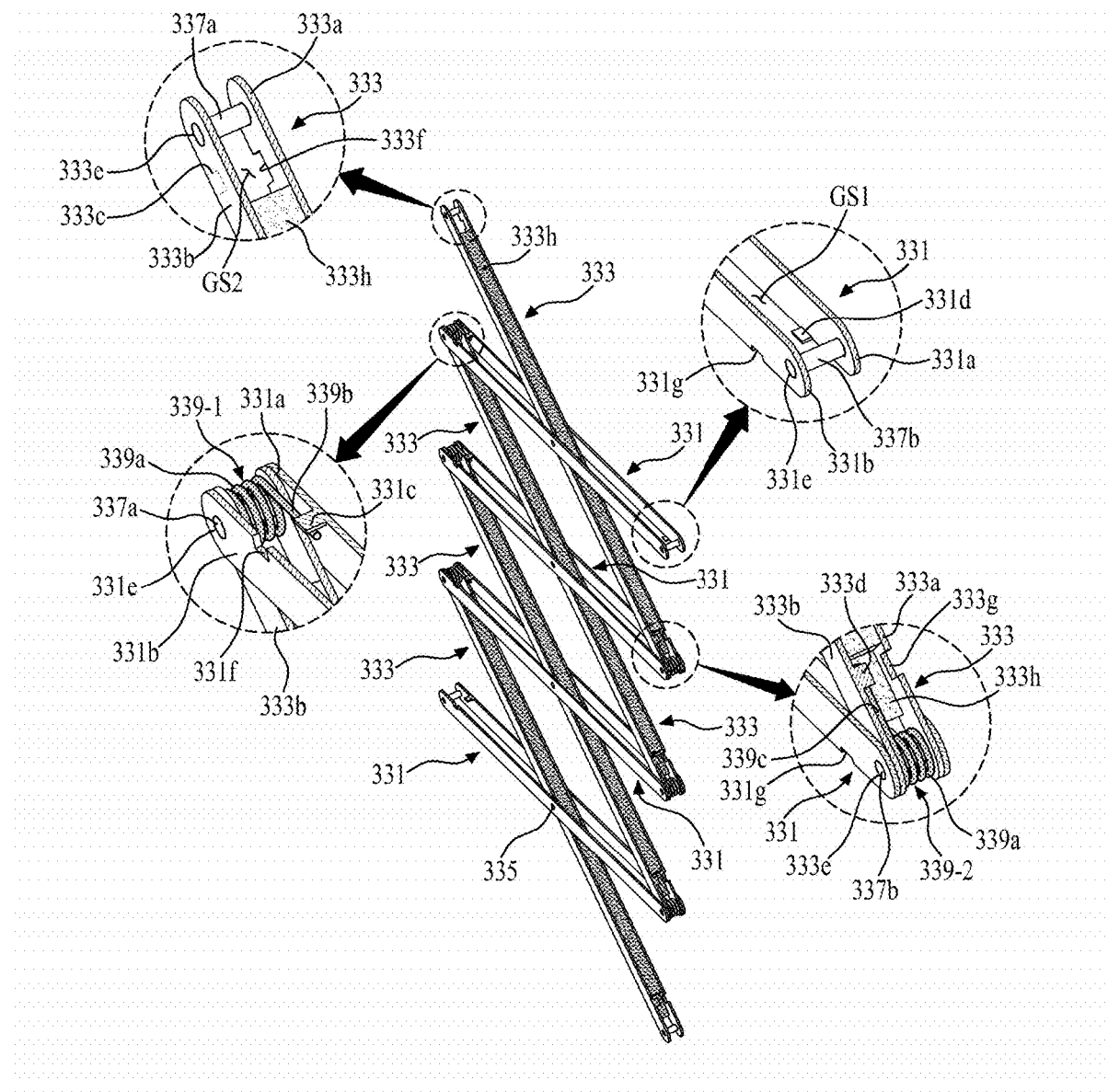
FIG. 6 is a perspective view illustrating a retractable unit illustrated in FIG. 5.

In one embodiment, the retractable unit 330, as exemplarily illustrated in FIGS. 5 and 6, may include a plurality of first links 331, a plurality of second links 333, a plurality of hinge members 335, a plurality of joint members 337, and a plurality of elastic members 339. The retractable unit 330 according to the present embodiment may be configured as a pantograph in which the elastic members 339 are installed to the respective joint members 337.

The respective first links 331 have a constant length and are arranged to intersect with the respective second links 333. In one embodiment, each of the first links 331 may include a first link plate 331a, a second link plate 331b, a first stopper 331c, and a second stopper 331d.

The respective first and second link plates 331a and 331b have a constant thickness and a constant length and are arranged in parallel to face each other with a first gap space GS1 interposed therebetween. The respective first and second link plates 331a and 331b may be formed of a metal material, more specifically, a stainless material to attain the high strength of the retractable unit 330. The first and second link plates 331a and 331b are rotatably supported at the central portions thereof by the hinge member 335.

As both side edge portions of the respective first and second link plates 331a and 331b are rotatably supported by the joint member 337, the first gap space GS1 is provided between the first and second link plates 331a and 331b. To this end, joint insertion holes 331e are formed in the side edge portions of the respective first and second link plates 331a and 331b.

The first stopper 331c is bent from one side upper edge of the first link plate 331a toward the second link plate 331b to have a given width and length. That is, the first stopper 331c may be provided by bending a portion of the first link plate 331a, provided between a pair of incisions cut in the upper surface of one side edge of the first link plate 331a to have a constant distance, toward the second link plate 331b. The first stopper 331c functions to support or fix one side of the corresponding elastic member 339.

The second stopper 331d is bent from the other side lower edge of the first link plate 331a toward the second link plate 331b to have a given width and length. That is, the second stopper 331d may be provided by bending a portion of the first link plate 331a, provided between a pair of incisions cut in the lower surface of the other side edge of the first link plate 331a to have a constant distance, toward the second link plate 331b. The second stopper 331d functions to support or fix the other side of the corresponding elastic member 339.

The respective second links 333 have the same size as the respective first links 331. The respective second links 333 intersect with the respective first links 331 in an X-shaped form to penetrate the first links 331, which may reduce the thickness of intersections between the first links 331 and the second links 333. In one embodiment, each of the second links 333 may include a third link plate 333a, a fourth link plate 333b, a third stopper 333c, and a fourth stopper 333d.

The respective third and fourth link plates 333a and 333b have a constant thickness and a constant length and are arranged in parallel to face each other with a second gap space GS2 interposed therebetween. The respective third and fourth link plates 333a and 333b may be formed of a metal material, more specifically, a stainless material to attain the high rigidity of the retractable unit 330. The third and fourth link plates 333a and 333b are rotatably supported at the central portions thereof by the hinge member 335 which supports the central portion of the corresponding first link 331. As such, the third and fourth link plates 333a and 333b are rotatable in the first gap space GS1 between the first and second link plates 331a and 331b about the hinge member 335 serving as a rotation axis.

Both side edge portions of the respective third and fourth link plates 333a and 333b are rotatably supported by the joint member 337. To this end, joint insertion holes 333e are formed in the side edge portions of the respective third and fourth link plates 333a and 333b.

The third stopper 333c is bent from one side lower edge of the fourth link plate 333b, located inside the second link plate 331b, toward the third link plate 333a to have a given width and length. That is, the third stopper 333c may be provided by bending a portion of the fourth link plate 333b, provided between a pair of incisions cut in the lower surface of one side edge of the fourth link plate 333b to have a constant distance, toward the third link plate 333a.

The fourth stopper 333d is bent from the other side upper edge of the fourth link plate 333b toward the third link plate 333a to have a given width and length. That is, the fourth stopper 333d may be provided by bending a portion of the fourth link plate 333b, provided between a pair of incisions cut in the upper surface of the other side edge of the fourth link plate 333b to have a constant distance, toward the third link plate 333a.

In addition, each of the first links 331 may further include first and second stopper insertion recesses 331f and 331g. Each of the second links 333 may further include third and fourth stopper insertion recesses 333f and 333g.

The first stopper insertion recess 331f is indented at a given depth from the upper surface of one side edge of the second link plate 331b facing the first stopper 331c. Upon the folding of the retractable unit 330, the third stopper 333c provided at the adjacent second link 333 is inserted into the first stopper insertion recess 331f.

The second stopper insertion recess 331g is indented at a given depth from the lower surface of the other side edge of the second link plate 331b facing the second stopper 331d. Upon the folding of the retractable unit 330, the fourth stopper 333d provided at the adjacent second link 333 is inserted into the second stopper insertion recess 331g.

The third stopper insertion recess 333f is indented at a given depth from the lower surface of one side edge of the third link plate 333a facing the third stopper 333c. Upon the folding of the retractable unit 330, the first stopper 331c provided at the adjacent first link 331 is inserted into the third stopper insertion recess 333f.

The fourth stopper insertion recess 333g is indented at a given depth from the upper surface of the other side edge of the third link plate 333a facing the fourth stopper 333d. Upon the folding of the retractable unit 330, the second stopper 331d provided at the adjacent first link 331 is inserted into the fourth stopper insertion recess 333g.

In addition, each of the second links 333 may further include a reinforcement member 333h.

The reinforcement member 333h may be a rectangular metal block fitted in the second gap space GS2 defined between the third and fourth link plates 333a and 333b of each of the second links 333.

In one embodiment, to increase the strength of each second link 333, the reinforcement member 333h may be formed of the same metal material as the respective third and fourth link plates 333a and 333b. In addition, the reinforcement member 333h and the third and fourth link plates 333a and 333b may be formed of the same metal material, for example, a stainless material to thereby be integrated with each other to construct a single body.

In another embodiment, the reinforcement member 333h may be formed of a metal material having a lower strength than that of the respective third and fourth link plates 333a and 333b, for example, aluminum. Here, the reinforcement member 333h may be coupled to the inner side surfaces of the respective third and fourth link plates 333a and 333b using fastening members (not illustrated) such as, for example, screws. The reinforcement member 333h according to the present embodiment may increase the strength of each second link 333 without increasing the weight of the second link 333.

Each of the hinge members 335 is located at an intersection of the first link 331 and the second link 333 to rotatably support the central portions of the first and second links 331 and 333 such that the first and second links 331 and 333 intersect each other in an X-shaped form. In this way, the first link 331 is rotatable about the hinge member 335, and the second link 333 is rotatable inside the first link 331, i.e. in the first gap space GS1 between the first and second link plates 331 and 331b about the hinge member 335.

Each of the joint members 337 is configured to rotatably support joint portions, that is, connection portions of the first link 331 and the second link 333 which are vertically adjacent to each other. That is, the joint member 337 is inserted into joint insertion holes 331e and 333e of the vertically adjacent first and second links 331 and 333 to connect ends of the vertically adjacent first and second links 331 and 333 in a zigzag form. The joint members 337 according to one embodiment may include first and second joint pins 337a and 337b.

The first joint pin 337a is inserted into the joint insertion holes 331e and 333e formed in one side ends of the first link 331 and the second link 333 which are vertically adjacent to each other, thereby rotatably supporting one side ends of the vertically adjacent first and second links 331 and 333.

The second joint pin 337b is inserted into the joint insertion holes 331e and 333e formed in the other side ends of the first link 331 and the second link 333 which are vertically adjacent to each other, thereby rotatably supporting the other side ends of the vertically adjacent first and second links 331 and 333.

An uppermost first joint pin 337a1, which supports an uppermost first link among the first links 331, is movably installed in a first upper guide hole 312a formed in the upper frame 310. In addition, an uppermost second joint pin 337b1, which supports an uppermost second link among the second links 333, is movably installed in a second upper guide hole 312b formed in the upper frame 310. The respective first and second upper guide holes 312a and 312b guide movement of the respective uppermost first and second links to enable the folding and unfolding of the first and second links 331 and 333.

A lowermost first joint pin 337a2, which supports a lowermost first link among the first links 331, is movably installed in a first lower guide hole 322a formed in the lower frame 320. In addition, a lowermost second joint pin 337b2, which supports a lowermost second link among the second links 333, is movably installed in a second lower guide hole 322b formed in the lower frame 320. The respective first and second lower guide holes 322a and 322b guide movement of the respective lowermost first and second links to enable the folding and unfolding of the first and second links 331 and 333.

The elastic members 339 are individually installed to the respective joint members 337 so as to be supported by the ends of the vertically adjacent first and second links 331 and 333. The elastic members 339 are compressed when the flexible display module 100 is moved downward, thereby providing the vertically adjacent respective first and second links 331 and 333 with compressive restoration force when the flexible display module 100 is moved upward. That is, the elastic members 339 serve to rotate the vertically adjacent first and second links 331 and 333 upon the unfolding of the retractable unit 330, thereby reducing load applied to the link elevating unit 340 when the flexible display module 100 is moved upward.

In one embodiment, the elastic members 339 may include first and second torsion springs 339-1 and 339-2.

The first torsion spring 339-1 is configured to surround the joint member 337 which supports one side of each of the vertically adjacent first and second links 331 and 333 and supported by one side ends of the vertically adjacent first and second links 331 and 333. As such, the first torsion spring 339-1 is compressed upon the folding of the vertically adjacent first and second links 331 and 333 and rotates one side of the vertically adjacent first and second links 331 and 333 via compressive restoration force upon the unfolding of the vertically adjacent first and second links 331 and 333.

The second torsion spring 339-2 is configured to surround the joint member 337 which supports the other side of each of the vertically adjacent first and second links 331 and 333 and supported by the other side ends of the vertically adjacent first and second links 331 and 333. As such, the second torsion spring 339-2 is compressed upon the folding of the vertically adjacent first and second links 331 and 333 and rotates the other side of the vertically adjacent first and second links 331 and 333 via compressive restoration force upon the unfolding of the vertically adjacent first and second links 331 and 333.

Each of the first and second torsion springs 339-1 and 339-2 according to the above-described embodiment may include a coil portion 339a, a first elastic arm 339b, and a second elastic arm 339c.

The coil portion 339a has a constant diameter and is spirally wound to surround the joint member 337.

The first elastic arm 339b extends, by a long length, from one end of the coiled portion 339a and is supported by or fixed to one side or the other side of the first link 331. For example, the first elastic arm 339b of the first torsion spring 339-1 may be fixed by the first stopper 331c provided at the first link 331 and the first elastic arm 339b of the second torsion spring 339-2 may be fixed by the second stopper 331d provided at the first link 331.

The second elastic arm 339c extends, by a long length, from the other end of the coiled portion 339a and is supported by or fixed to one side or the other side of the second link 333. For example, the second elastic arm 339c of the first torsion spring 339-1 may be fixed by the third stopper 333c provided at the second link 333 and the second elastic arm 339c of the second torsion spring 339-2 may be fixed by the fourth stopper 333d provided at the second link 333.

As described above, the retractable unit 330 may be folded or unfolded via the rotation of the respective first and second links 331 and 333 about the hinge members 335 and the joint members 337, thereby enabling the easy vertical movement of the upper frame 310.

The link elevating unit 340 serves to fold or unfold the retractable unit 330 so as to vertically move the upper frame 310, thereby vertically moving the flexible display module 100. That is, the link elevating unit 340 is adapted to fold or unfold the respective first and second links 331 and 333 by vertically moving a lowermost hinge member 335a among the hinge members 335, thereby expanding or contracting the length of the retractable unit 330.

Figure 7:
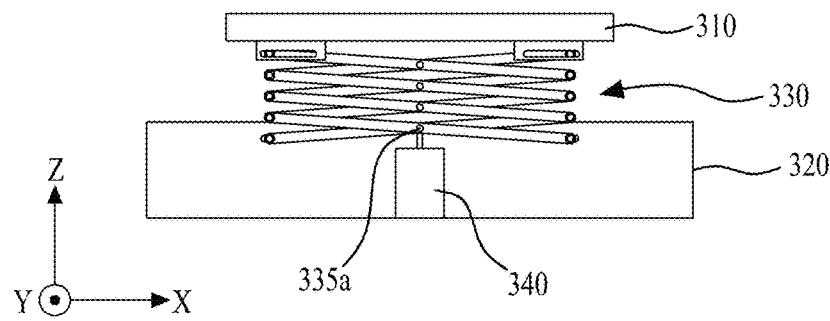
FIG. 7 is a view illustrating a state in which an upper frame is downwardly moved via the winding driving of a frame elevating unit illustrated in FIG. 5.

For example, upon the winding of the flexible display module 100, as exemplarily illustrated in FIG. 7, the link elevating unit 340 moves the lowermost hinge member 335a downward to fold the respective first and second links 331 and 333. Consequently, the link elevating unit 340 moves the upper frame 310 downward, thereby allowing the flexible display module 100 to be wound and inserted into the frame module 200. In contrast, upon the unwinding of the flexible display module 100, as exemplarily illustrated in FIG. 5, the link elevating unit 340 moves the lowermost hinge member 335a upward to unfold the respective first and second links 331 and 333. Consequently, the link elevating unit 340 moves the upper frame 310 upward, thereby allowing the flexible display module 100 wound inside the frame module 200 to be unwound so as to stand vertically upright.

In one embodiment, the link elevating unit 340 may be a cylinder member such as an air cylinder or a pneumatic cylinder having an elevating shaft connected to the lowermost hinge member 335a, or may be a linear motor. In this way, the present invention may realize the easy vertical movement of the flexible display module 100 using the link elevating unit 340 and may simplify the configuration of the link elevating unit 340 and, consequently, the internal configuration of the frame module 200.

Referring again to FIGS. 1 to 4, the cover housing 400 is an outermost case which is configured to cover the frame module 200 and has a panel elevating slot 410 for the introduction and removal of the flexible display module 100. The cover housing 400 hides the frame module 200 and the panel elevating module 300.

In addition, in the flexible display apparatus 10 according to one embodiment of the present invention, the flexible display module 100 may further include a rear curtain 160 and the frame module 200 may further include a rear curtain roller 250.

The rear curtain 160 is coupled to the rear surface of the upper side of the panel elevating module 300 so as to cover the rear surface of the panel elevating module 300. That is, the rear curtain 160 is wound around the rear curtain roller 250 provided inside the frame module 200 when the panel elevating module 300 is moved downward and is unwound from the rear curtain roller 250 to cover the rear surface of the panel elevating module 300 when the panel elevating module 300 is moved upward. As such, the rear curtain 160 serves to provide the flexible display apparatus 10 with an aesthetically pleasant appearance. The rear curtain 160 may be formed of a colored flexible material, for example, a fibrous material, or may be a heat radiation sheet to dissipate the heat of the flexible display module 100.

The rear curtain roller 250 is installed inside the frame module 200 such that the rear curtain 160 is wound around or unwound from the rear curtain roller 250 via the vertical movement of the panel elevating module 300.

In one embodiment, one end of the rear curtain roller 250 is rotatably installed to the upper side of the first support frame 220 so as to be located adjacent to the lower frame 320 of the panel elevating module 300, and the other end of the rear curtain roller 250 is rotatably installed to the upper side of the second support frame 230 so as to be located adjacent to the lower frame 320 of the panel elevating module 300. At this time, rolling bearings (not illustrated) may be interposed between the respective first and second support frames 220 and 230 and the rear curtain roller 250. The rear curtain roller 250 according to the present embodiment is rotated in the first direction by pushing force applied by the winding driving of the panel elevating module 300 so as to enable the winding of the rear curtain 160 and is rotated in the second direction by pulling force applied by the unwinding driving of the panel elevating module 300 so as to enable the unwinding of the rear curtain 160.

In another embodiment, the rear curtain roller 250 is configured to be rotated by the compression and compressive restoration force of a spiral spring in the same manner as the panel roller 210 according to the above-described embodiment and, thus, a detailed description thereof will be omitted below.

In addition, the frame module 200 may further include a second guide roller 252 installed between the first and second support frames 220 and 230 at a position adjacent to the rear curtain roller 250. The second guide roller 252 serves to maintain the constant tension of the rear curtain 160 as the rear curtain 160 is wound around or unwound from the rear curtain roller 250.

In addition, the flexible display apparatus 10 according to one embodiment of the present invention may further include an upper portion cover 500.

The upper portion cover 500 is configured to cover the upper edge portion and the side surface of the flexible display module 100 to hide the non-display area and the pad portion provided at the upper edge portion of the flexible display panel 110 and the panel driving circuit unit 120 connected to the pad portion. The upper portion cover 500 according to one embodiment may consist of a front surface portion which covers the upper edge portion of the front surface of the flexible display panel 110, sidewall portions which surround the upper side and both lateral sides of the flexible display module 100, and a rear surface portion which covers the upper side of the rear surface of the panel elevating module 300 including the upper side of the rear surface of the flexible display module 100. The upper portion cover 500 serves as an outermost protective cover provided at the upper edge portion of the flexible display apparatus 10.

In addition, the flexible display apparatus 10 according to one embodiment of the present invention may further include a side curtain unit 600 provided at the upper portion cover 500.

The side curtain unit 600 is installed to the upper portion cover 500, more specifically, to both edges of the upper portion cover 500 to cover both side surfaces of each of the panel elevating module 300 and the flexible display module 100, which provides the flexible display apparatus 10 with an astatically pleasant appearance.

In one embodiment, the side curtain unit 600 may include a first side curtain roller 610, a second side curtain roller 620, a first side curtain 630, and a second side curtain 640.

The first side curtain roller 610 is rotatably installed to the upper portion cover 500 so as to be adjacent to one side surface of the flexible display module 100. The first side curtain roller 610 is configured to be rotated by the compression and compressive restoration force of a spiral spring in the same manner as the panel roller 210 according to the above-described embodiment and, thus, a detailed description thereof will be omitted below. The spiral spring mounted in the first side curtain roller 610 is compressed via the first direction rotation of the first side curtain roller 610 when the flexible display module 100 is moved upward and rotates the first side curtain roller 610 in the second direction by compressive restoration force thereof when the flexible display module 100 is moved downward.

The second side curtain roller 620 is rotatably installed to the upper portion cover 500 so as to be adjacent to the other side surface of the flexible display module 100. The second side curtain roller 620 is configured to be rotated by the compression and compressive restoration force of a spiral spring in the same manner as the panel roller 210 according to the above-described embodiment and, thus, a detailed description thereof will be omitted below. The spiral spring mounted in the second side curtain roller 620 is compressed via the second direction rotation of the second side curtain roller 620 when the flexible display module 100 is moved upward and rotates the second side curtain roller 620 in the first direction by compressive restoration force thereof when the flexible display module 100 is moved downward.

Figure 8:
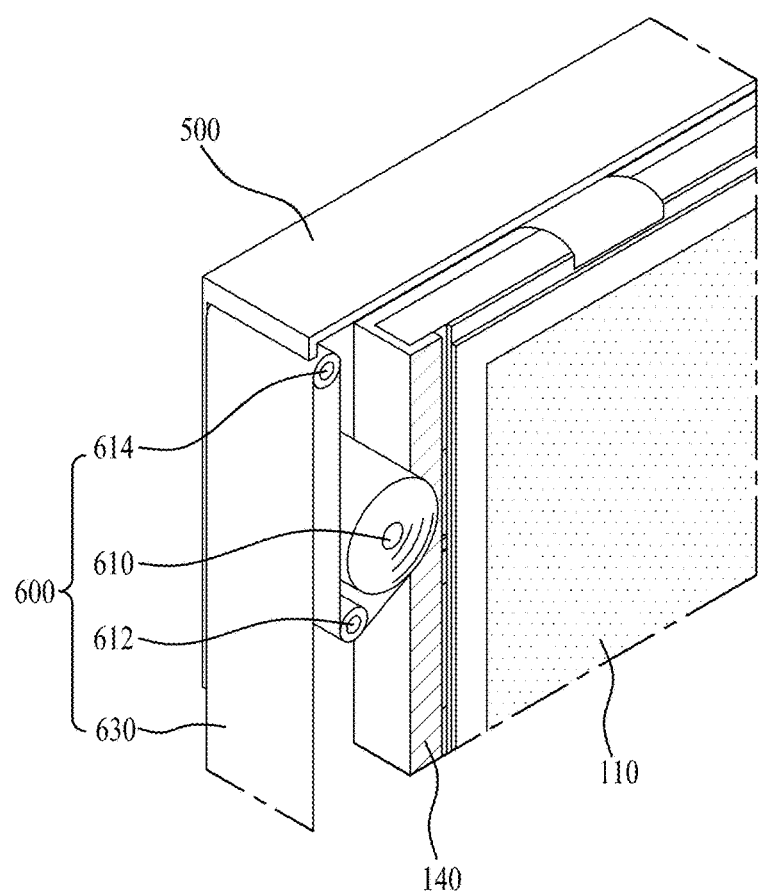
FIG. 8 is a view explaining a side-surface curtain unit according to the present invention.

The first side curtain 630 is installed between the first side curtain roller 610 and the frame module 200. That is, an upper end of the first side curtain 630 is coupled to the first side curtain roller 610 and a lower end of the first side curtain 630 is fixed to the inner surface of the first support frame 220 of the frame module 200. The first side curtain 630 as described above is wound around the first side curtain roller 610 via the second direction rotation of the first side curtain roller 610 when the flexible display module 100 is moved downward and is unwound from the first side curtain roller 610 via the first direction rotation of the first side curtain roller 610 when the flexible display module 100 is moved upward. In this way, the first side curtain 630, as exemplarily illustrated in FIG. 8, is unwound from the first side curtain roller 610 to cover one side surface of each of the panel elevating module 300 and the flexible display module 100 when the flexible display module 100 is moved upward, thereby providing the flexible display apparatus 10 with an improved aesthetically pleasant appearance.

The second side curtain 640 is installed between the second side curtain roller 620 and the frame module 200. That is, an upper end of the second side curtain 640 is coupled to the second side curtain roller 620 and a lower end of the second side curtain 640 is fixed to the inner surface of the second support frame 230 of the frame module 200. The second side curtain 640 as described above is wound around the second side curtain roller 620 via the first direction rotation of the second side curtain roller 620 when the flexible display module 100 is moved downward and is unwound from the second side curtain roller 620 via the second direction rotation of the second side curtain roller 620 when the flexible display module 100 is moved upward. In this way, the second side curtain 640, as exemplarily illustrated in FIG. 8, is unwound from the second side curtain roller 620 to cover the other side surface of each of the panel elevating module 300 and the flexible display module 100 when the flexible display module 100 is moved upward, thereby providing the flexible display apparatus 10 with an improved aesthetically pleasant appearance.

In one embodiment, the side curtain unit 600 may further include at least one third guide roller 612 or 614 installed adjacent to the first side curtain roller 610 or the second side curtain roller 620.

The third guide roller 612 or 614 adjacent to the first side curtain roller 610 serves to maintain the constant tension of the first side curtain 630 which is wound around or unwound from the first side curtain roller 610.

The third guide roller 612 or 614 adjacent to the second side curtain roller 620 serves to maintain the constant tension of the second side curtain 640 which is wound around or unwound from the second side curtain roller 620.

As described above, the flexible display apparatus 10 according to one embodiment of the present invention may have a small thickness because the flexible display module 100 is wound or unwound as the upper portion of the flexible display module 100 is moved upward or downward via the driving of the panel elevating module 300 and may also ensure the easy winding or unwinding of the flexible display module 100. In addition, the flexible display apparatus 10 according to one embodiment of the present invention may maintain the outwardly pulled flexible display panel 110 in a planar state by supporting the rear surface of the outwardly pulled flexible display panel 110 using the flexible rear cover 140, thereby improving the vertical flatness of the flexible display panel 110.

Figure 9:
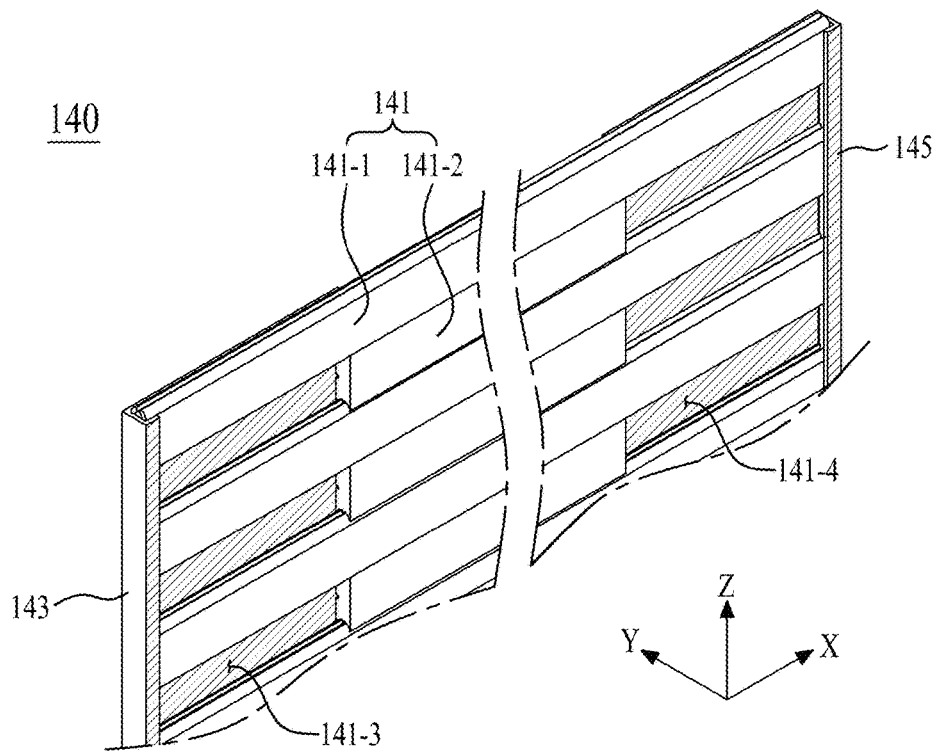
FIG. 9 is a view explaining a second embodiment of a flexible rear cover in the flexible display apparatus according to the present invention.
Figure 10:
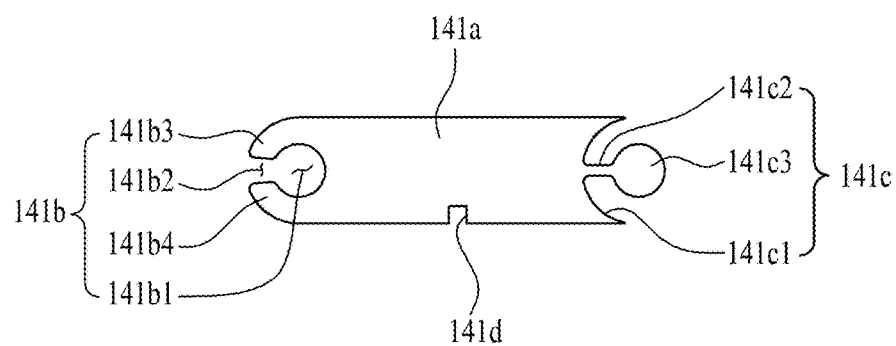
FIG. 10 is a sectional view explaining first and second support bars illustrated in FIG. 9.

FIG. 9 is a view explaining a second embodiment of a flexible rear cover in the flexible display apparatus according to the present invention, and FIG. 10 is a sectional view explaining first and second support bars illustrated in FIG. 9.

Referring to FIGS. 9 and 10, the flexible rear cover 140 according to the second embodiment includes the panel support unit 141, the first side surface protective cover 143, and the second side surface protective cover 145.

The panel support unit 141 may include a plurality of first and second support bars 141-1 and 141-2, which are rotatably connected to one another to cover the rear surface of the flexible display panel 110 while supporting the rear surface of the flexible display panel 110.

The first support bars 141-1 are formed to have a first length that is longer than the length of the flexible display panel 110 by a predetermined length and are arranged in parallel with one another so as to be spaced apart from one another by a constant distance.

The second support bars 141-2 are located respectively between the first support bars 141-1 and are rotatably connected to the respective neighboring first support bars 141-1. The second support bars 141-2 have a second length shorter than the first length of the first support bars 141-1 and, more specifically, have a length shorter than the length of the flexible display panel 110 by a predetermined length.

The first side surface protective cover 143 is configured to surround the front surface edge, the side surface and the rear surface of one side portion of each of the first support bars 141-1 protruding outward from one side surface of the respective second support bars 141-2, thereby absorbing external shock applied to one side surface of each of the first support bars 141-1. The first side surface protective cover 143 may be formed of an elastic material, for example, silicon or urethane. First slippage prevention spaces 141-3 are defined between one side portions of the respective first support bars 141-1 protruding outward from one side surfaces of the respective second support bars 141-2. Bending portions of the first side surface protective cover 143 are received in the first slippage prevention spaces 141-3 upon the rotation of the respective first support bars 141-1, which may prevent slippage between the first side surface protective cover 143 and the panel support unit 141.

The second side surface protective cover 145 is configured to surround the front surface edge, the side surface and the rear surface of the other side portion of each of the first support bars 141-1 protruding outward from the other side surface of the respective second support bars 141-2, thereby absorbing external shock applied to the other side surface of each of the first support bars 141-1. The second side surface protective cover 145 may be formed of the same material as the first side surface protective cover 143. Second slippage prevention spaces 141-4 are defined between the other side portions of the respective first support bars 141-1 protruding outward from the other side surfaces of the respective second support bars 141-2. Bending portions of the second side surface protective cover 145 are received in the second slippage prevention spaces 141-4 upon the rotation of the respective first support bars 141-1, which may prevent slippage between the second side surface protective cover 145 and the panel support unit 141.

Each of the first and second support bars 141-1 and 141-2 includes a body 141a, a first connection portion 141b and a second connection portion 141c.

The body 141a has a rectangular shape to have a length corresponding to the length of each first support bar 141-1 or each second support bar 141-2. The body 141a may be formed of a plastic material. In addition, the body 141a may have a longitudinal hollow region. The hollow region reduces the weight of the body 141a and, consequently, reduces the weight of the flexible rear cover 140.

The first connection portion 141b is provided at one side of the body 141a and is rotatably connected to the second connection portion 141c of the neighboring support bar 141-1 or 141-2. In one embodiment, the first connection portion 141b has a hinge insertion hole 141b1 and a hinge passage hole 141b2.

The hinge insertion hole 141b1 is longitudinally perforated in an one side edge portion of the body 141a.

Figure 11:
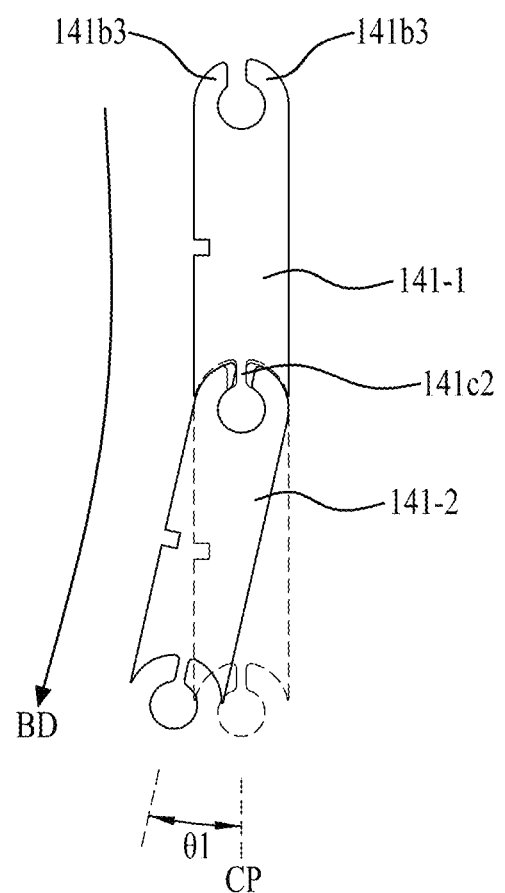
FIG. 11 is a view explaining a rotation angle of the first and second support bars illustrated in FIG. 9.

An outer region of the hinge insertion hole 141b1 is exposed outward through the hinge passage hole 141b2. As such, a pair of rotation protrusions 141b3 and 141b4 is formed at one side surface of the body 141a so as to face each other with the hinge passage hole 141b2 interposed therebetween. Here, any one of the two rotation protrusions 141b3 and 141b4 may have a shorter length than the other one, as exemplarily illustrated in FIG. 11, in order to prevent the flexible display panel 110 from being rotated in the opposite direction of the bending direction BD.

The second connection portion 141c is provided at the other side of the body 141a so as to be rotatably connected to the first connection portion 141b of the neighboring support bar 141-1 or 141-2. In one embodiment, the second connection portion 141c includes a rotation guide surface 141c1, a rotation stopper 141c2, and a hinge shaft 141c3. The second connection portion 141c may have a "Ω"-shaped cross section for connection with the first connection portion 141b of the neighboring support bar 141-1 or 141-2.

The rotation guide surface 141c1 is indented from the other side surface of the body 141a to have a constant curvature. At this time, the rotation guide surface 141c1 may have the same curvature as the curvature of the rotation protrusions 141b3 and 141b4 formed at the first connection portion 141b.

The rotation stopper 141c2 protrudes from a middle portion of the rotation guide surface 141c1. At this time, the length of the rotation stopper 141c2 is longer than the length of the hinge passage hole 141b2 of the first connection portion 141b by a predetermined length. The rotation stopper 141c2 constrains the rotation of the rotation protrusions 141b3 and 141b4 provided at the first connection portion 141b when rotated along with the first connection portion 141b of the neighboring support bar 141-1 or 141-2, thereby limiting the rotation angle of the neighboring support bar 141-1 or 141-2.

The hinge shaft 141c3 is provided at a distal end of the rotation stopper 141c2. As the hinge shaft 141c3 is inserted into the hinge insertion hole 141b1 by passing through the hinge passage hole 141b2 of the first connection portion 141b, the neighboring support bars 141-1 and 141-2 are rotatably connected to each other. The hinge shaft 141c3 may take the form of a cylinder parallel to the longitudinal direction of the body 141a.

Consequently, the first and second connection portions 141b and 141c have opposite shapes for the rotatable connection of the neighboring support bars 141-1 and 141-2.

As described above, the respective first and second support bars 141-1 and 141-2 are rotatably connected to each other via the connection of the hinge shaft 141c3 and the hinge insertion hole 141b1. At this time, as exemplarily illustrated in FIG. 11, as a result of limiting the rotation angle of the rotation protrusions 141b3 and 141b4 by the rotation stopper 141c2, the respective first and second support bars 141-1 and 141-2 are rotatable in a direction corresponding to the bending direction BD of the flexible display panel 110, but are not rotatable in an opposite direction of the bending direction BD of the flexible display panel 110. In this way, the respective first and second support bars 141-1 and 141-2 may be bent at a curvature corresponding to the bending curvature of the flexible display panel 110 upon the winding of the flexible display module 100 and may remain vertically upright to support the rear surface of the flexible display panel 110 in the planar state upon the unwinding of the flexible display module 100.

In addition, each of the first and second support bars 141-1 and 141-2 may have a bending prevention groove 141d formed in the rear surface of the body 141a.

The bending prevention groove 141d is indented in the rear surface of the body 141a to extend in the longitudinal direction of the body 141a. The bending prevention groove 141d increases the rigidity of the body 141a to minimize the bending of the body 141a. In addition, the bending prevention groove 141d serves to improve the assembly efficiency of the first and second support bars 141-1 and 141-2.

Figure 12:
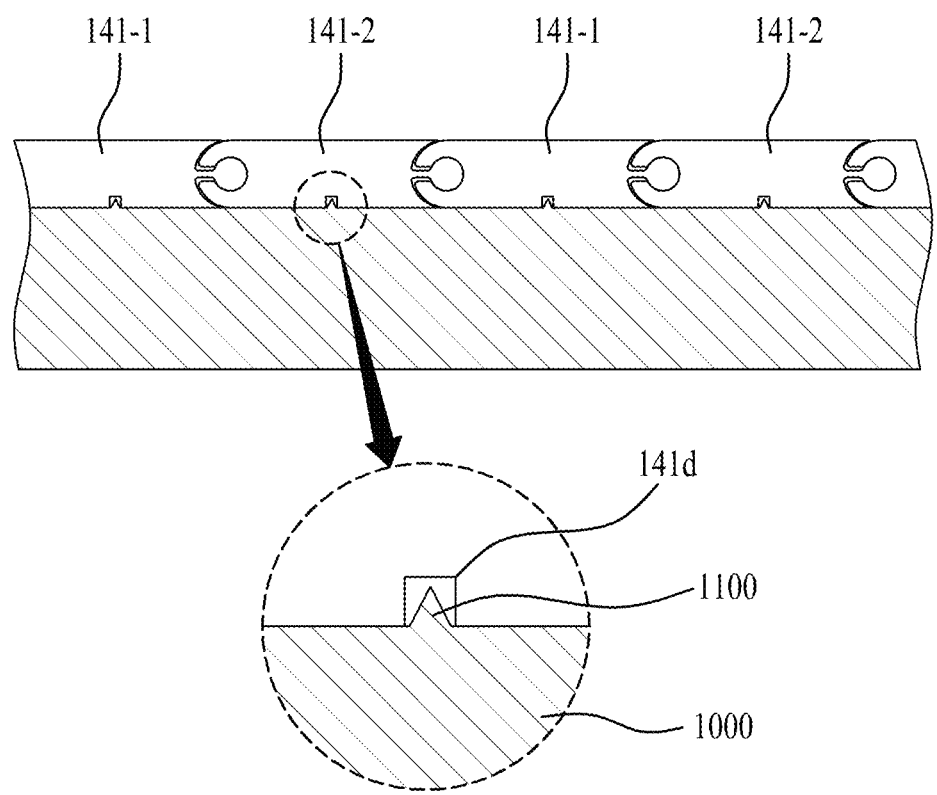
FIG. 12 is a view explaining an assembly method of a panel support unit in the flexible rear cover according to the present invention.

FIG. 12 is a view explaining an assembly method of a panel support unit in the flexible rear cover according to the present invention.

The assembly method of the panel support unit according to the present invention will be described below with reference to FIG. 12.

First, there is provided a jig 1000 that includes a plurality of protruding alignment lines 1100 spaced apart from one another by a constant distance. Here, the protruding alignment lines 1100 may protrude from the upper surface of the jig 1000 so as to be inserted into the bending prevention grooves 141d formed in the support bars. The protruding alignment lines 1100 may have a triangular cross section to ensure easy insertion thereof into the bending preventing grooves 141d. The distance between the protruding alignment lines 1100 may correspond to a distance between the bending prevention grooves 141d formed in the respective neighboring support bars connected to each other, that is, the first and second support bars 141-1 and 141-2.

Subsequently, the first and second support bars 141-1 and 141-2 are alternately arranged on the protruding alignment lines 1100 so as to be alternately connected to one another.

Subsequently, among the first and second support bars 141-1 and 141-2 arranged on the jig 1000 so as to be alternately and successively connected to one another, the respective first support bars 141-1 are connected at one side portion and the other side portion thereof to respective side surface protective covers. In this way, the assembly process of the panel support unit 141, including the first and second support bars 141-1 and 141-2 successively connected to one another, is completed.

The assembly method of the panel support unit according to the present invention as described above may improve the assembly efficiency of the first and second support bars 141-1 and 141-2 through the use of the jig 1000 having the protruding alignment lines 1100 inserted into the bending preventing grooves 141d of the respective first and second support bars 141-1 and 141-2.

Figure 13:
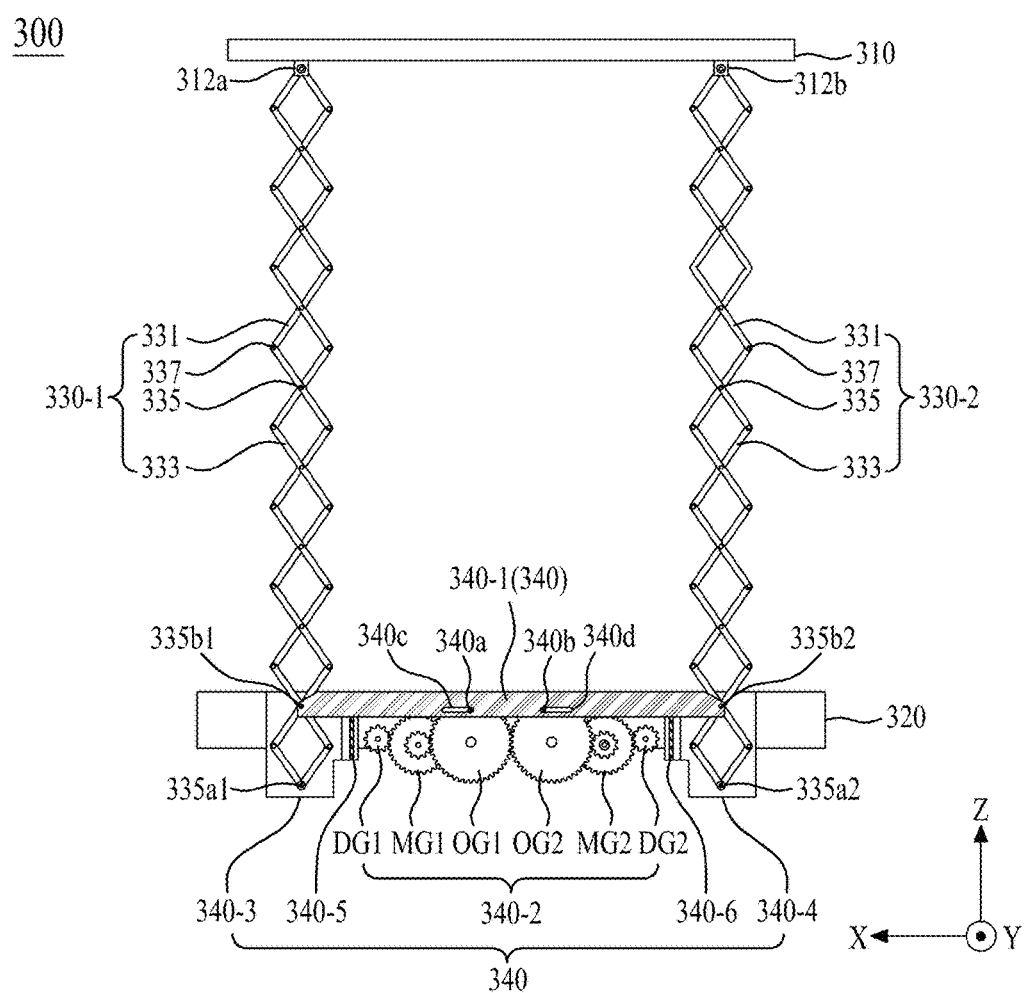
FIG. 13 is a view explaining another embodiment of a panel elevating module in the flexible display apparatus according to the present invention.
Figure 14:
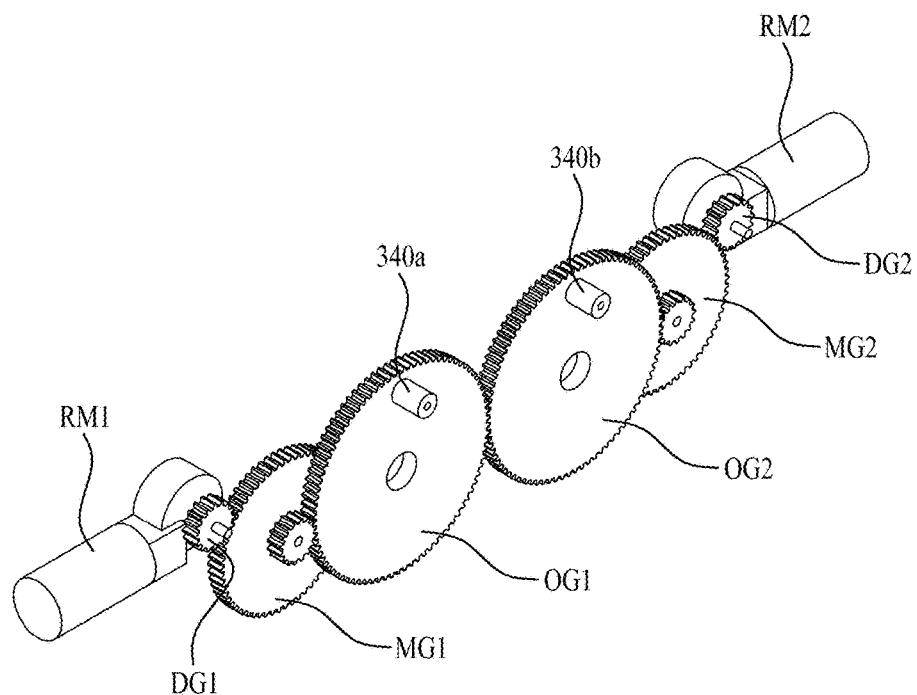
FIG. 14 is a view explaining a gear assembly illustrated in FIG. 13.
Figure 15:
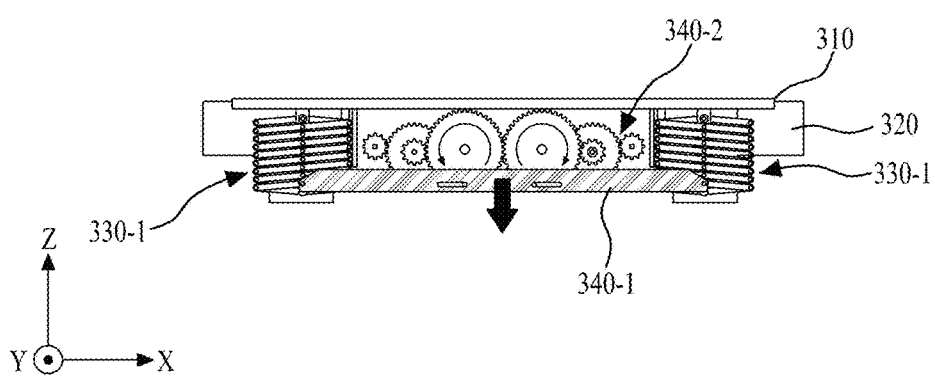
FIG. 15 is a view illustrating a state in which an upper frame is downwardly moved via the winding driving of a link elevating unit illustrated in FIG. 13.

FIG. 13 is a view explaining another embodiment of a panel elevating module in the flexible display apparatus according to the present invention, FIG. 14 is a view explaining a gear assembly illustrated in FIG. 13, and FIG. 15 is a view illustrating the downwardly moved state of an upper frame caused by the winding driving of a link elevating unit illustrated in FIG. 13.

Referring to FIGS. 13 to 15, the panel elevating module 300 according to another embodiment includes the upper frame 310, the lower frame 320, a pair of retractable units 330-1 and 330-2, and the link elevating unit 340.

The upper frame 310 and the lower frame 320 are identical to those of FIG. 5 and, thus, a repeated description thereof will be omitted below.

Each of the retractable units 330-1 and 330-2 may be configured as a pantograph. In one embodiment, each of the retractable units 330-1 and 330-2 includes the first links 331, the second links 333, the hinge members 335, the joint members 337, and the elastic members 339. This is identical to the retractable unit 330 illustrated in FIGS. 5 and 6 and, thus, a repeated description thereof will be omitted below. As such, each of the first and second retractable units 330-1 and 330-2 may be folded or unfolded via the rotation of the first and second links 331 and 333 about the respective hinge members 335 and the respective joint members 337, thereby easily vertically moving the upper frame 310 and, more particularly, implementing the balanced vertical movement of the upper frame 310.

The link elevating unit 340 is adapted to vertically move the upper frame 310 by simultaneously folding or unfolding the retractable units 330-1 and 330-2, thereby vertically moving the flexible display module 100. That is, the link elevating unit 340 folds or unfolds the first and second links 331 and 333 of the respective retractable units 330-1 and 330-2 by vertically moving second-lowermost hinge members 335b1 and 335b2 adjacent to lowermost hinge members 335a1 and 335a2 among the hinge members 335 of the respective retractable units 330-1 and 330-2, thereby implementing the simultaneous expansion or contraction of the lengths of the retractable units 330-1 and 330-2. In one embodiment, the link elevating unit 340 may include an elevating plate 340-1, a gear assembly 340-2, a pair of support brackets 340-3 and 340-4, and a pair of elevating guide members 340-5 and 340-6.

The elevating plate 340-1 is connected between the neighboring second-lowermost hinge members 335b adjacent to the lowermost hinge members 335a of the respective retractable units 330-1 and 330-2. The elevating plate 340-1 vertically moves the second-lowermost third hinge members 335b of the respective retractable units 330-1 and 330-2 via the driving of the gear assembly 340-2, thereby simultaneously expanding or contracting the lengths of the respective retractable units 330-1 and 330-2.

The gear assembly 340-2 vertically moves the elevating plate 340-1 via the driving of one or more rotation motors RM1 and RM2 installed to the lower frame 320. For example, the gear assembly 340-2 may move the elevating plate 340-1 upward via the forward rotation of the rotation motors RM1 and RM2 and move the elevating plate 340-1 downward via the reverse rotation of the rotation motors RM1 and RM2.

In one embodiment, the gear assembly 340-2 may include first and second drive gears DG1 and DG2, first and second intermediate gears MG1 and MG2, first and second output gears OG1 and OG2, first and second cams 340a and 340b, and first and second cam slots 340c and 340d.

The first drive gear DG1 is installed to one side portion of the lower frame 320 and is rotated via the rotation of a first rotation motor RM1 installed to the lower frame 320.

The second drive gear DG2 is installed to the other side portion of the lower frame 320 and is rotated via the rotation of a second rotation motor RM2 installed to the lower frame 320.

The first intermediate gear MG1 is installed to the lower frame 320 so as to engage with the first drive gear DG1 and is rotated in connection with the rotation of the first drive gear DG1. At this time, the first intermediate gear MG1 may be a speed reduction gear.

The second intermediate gear MG2 is installed to the lower frame 320 so as to engage with the second drive gear DG2 and is rotated in connection with the rotation of the second drive gear DG2. At this time, the second intermediate gear MG2 may be a speed reduction gear in the same manner as the first intermediate gear MG1.

The first output gear OG1 is installed to the lower frame 320 so as to engage with the first intermediate gear MG1 and is rotated in connection with the rotation of the first intermediate gear MG1.

The second output gear OG2 is installed to the lower frame 320 so as to simultaneously engage with the second intermediate gear MG2 and the first output gear OG1 and is rotated in connection with the rotation of the second intermediate gear MG2.

The first cam 340a is installed to one side of the front surface of the first output gear OG1 at a given height so as to be moved in a circular track according to the rotation of the first output gear OG1.

The second cam 340b is installed to one side of the front surface of the second output gear OG2 at a given height so as to be moved in a circular track according to the rotation of the second output gear OG2.

The first cam slot 340c is formed in the elevating plate 340-1 on the first output gear OG1 such that the first cam 340a is movably inserted into the first cam slot 340c. The first cam slot 340c may be a rectangular slot.

The second cam slot 340d is formed in the elevating plate 340-1 on the second output gear OG2 such that the second cam 340b is movably inserted into the second cam slot 340d. The second cam slot 340d may be a rectangular slot.

In the gear assembly 340-2 according to one embodiment as described above, the respective gears DG1, DG2, MG1, MG2, OG1 and OG2 are rotated in connection with the rotation of the respective first and second rotation motors RM1 and RM2 synchronized with each other so as to move the respective first and second cams 340a and 340b, thereby vertically moving the elevating plate 340-1 according to the movement of the respective first and second cams 340a and 340b. For example, the gear assembly 340-2 moves the elevating plate 340-1 upward as the respective first and second cams 340a and 340b are moved clockwise via the forward rotation of the respective first and second output gears OG1 and OG2 (the unwinding operation of the flexible display module 100) in connection with the forward rotation of the respective first and second rotation motors RM1 and RM2. In addition, the gear assembly 340-2 moves the elevating plate 340-1 downward as the respective first and second cams 340a and 340b are moved counterclockwise via the reverse rotation of the respective first and second output gears OG1 and OG2 in connection with the reverse rotation of the respective first and second rotation motors RM1 and RM2 (the winding operation of the flexible display module 100).

The support brackets 340-3 and 340-4 are installed in parallel with each other to the lower frame 320 with the gear assembly 340-2 interposed therebetween to support the respective retractable units 330-1 and 330-2. That is, the respective support brackets 340-3 and 340-4 support the lowermost hinge members 335a of the respective retractable units 330-1 and 330-2.

The elevating guide members 340-5 and 340-6 are installed in parallel with each other to the support brackets 340-3 and 340-4 to guide the vertical movement of the elevating plate 340-1. In one embodiment, the elevating guide member 340-5 and 340-6 may include guide rails formed in the respective support brackets 340-3 and 340-4 in the vertical direction Z and guide grooves formed in the rear surface of the elevating plate 340-1 to overlap with the guide rails. In this way, the elevating plate 340-1 may be vertically moved without distortion via the guiding of the elevating guide members 340-5 and 340-6, whereby the present invention may implement the balanced vertical movement of the flexible display module 100 without distortion.

As described above, for the winding of the flexible display module 100, the link elevating unit 340 folds the first and second links 331 and 333 of the respective retractable units 330-1 and 330-2 by downwardly moving the second-lowermost hinge members 335b via the downward movement of the elevating plate 340-1 in connection with the reverse rotation of the gear assembly 340-2, thereby downwardly moving the upper frame 310 to cause the flexible display module 100 to be wound around the panel roller of the frame module 200. Conversely, for the unwinding of the flexible display module 100, the link elevating unit 340 unfolds the first and second links 331 and 333 of the respective retractable units 330-1 and 330-2 by upwardly moving the second-lowermost hinge members 335b via the upward movement of the elevating plate 340-1 in connection with the forward rotation of the gear assembly 340-2, thereby upwardly moving the upper frame 310 to cause the flexible display module 100, wound around the panel roller of the frame module 200, to be unwound to stand vertically upright.

As described above, the panel elevating module 300 according to another embodiment is capable of achieving the balanced vertical movement of the flexible display module 100 by simultaneously varying the lengths of the retractable units 330-1 and 330-2 using the gear assembly 340-2 and improving the vertical flatness of the vertically upright flexible display panel 110 by supporting the flexible display module 100 using the retractable units 330-1 and 330-2.

Figure 16:
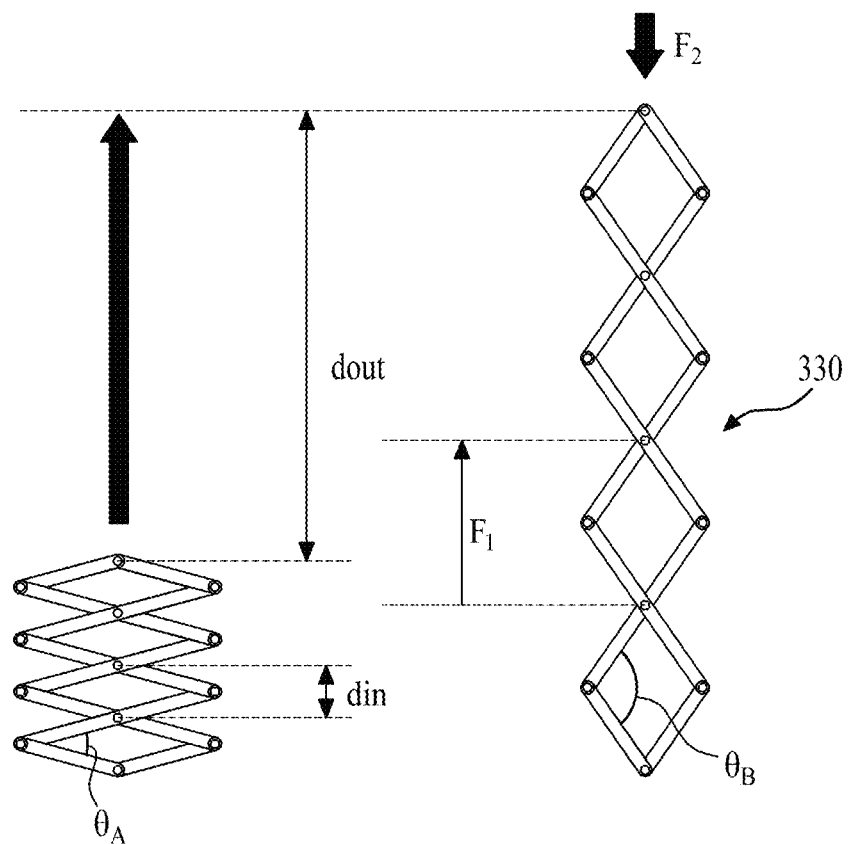
FIG. 16 is a view explaining the drive force of a retractable unit according to the present invention.

FIG. 16 is a view explaining the drive force of a retractable unit according to the present invention.

The drive force of the retractable unit according to the present invention will be described below with reference to FIG. 16.

First, assuming the weight of the retractable unit 330, the drive force of the retractable unit may be modeled as represented by the following Equation 1.

$$F_1 \cdot d_{in} = F_2 \cdot d_{out} + E_{friction} \qquad \text{Equation 1}$$

In Equation 1, $E_{friction}$ is the loss of friction generated at a joint of vertically adjacent first and second links, $F_1$ is the load applied to the retractable unit, $F_2$ is the drive force of the retractable unit, $d_{in}$ is the movement distance of a middle link, and $d_{out}$ is the movement distance of an uppermost link. In addition, the relationship of '$d_{out}/d_{in}=n$' is established based on the drive characteristics of the retractable unit.

For simplified modeling, approximation is performed as represented by the following Equation 2.

$$l \cdot \Delta\theta \cong d_{in}, n \cdot l \cdot \Delta\theta \cong d_{out} \qquad \text{Equation 2}$$

Equation 2 may be approximated as $\Delta\theta = \theta_B - \theta_{A-}$.

Assuming that the loss of energy generated at the joint per unit rotation angle of the links is 'c', the loss of energy generated at the joint during the unfolding of the first and second links becomes 'c×Δθ'. To briefly represent the loss of energy by applying it to Equation 2, the loss of energy generated at one joint may become '$c \cdot d_{in}/l$'. Since the number of joints will increase in proportion to the number of stages formed by the links, the loss of energy attributable to friction for the entire retractable unit may be represented by the following Equation 3.

$$E_{friction} = \frac{f_1(n) \cdot c \cdot d_{in}}{l} \qquad \text{Equation 3}$$

In Equation 3, $f_1(n)$ is the linear function of n and, therefore, the drive force F1 required to drive the retractable unit in the absence of an elastic member (or a torsion spring) according to the present invention may be represented by the following Equation 4.

$$F_1 = nF_2 + \frac{c}{l} f_1(n) \qquad \text{Equation 4}$$

Assuming that no spring is compressed when the retractable unit is completely unfolded, the following Equation 5 may be established.

$$F_1 \cdot d_{in} = F_2 \cdot d_{out} + E_{friction} - E_{spring} \quad \text{Equation 5}$$

In Equation 5, $E_{spring}$ is the energy stored in an elastic member in the compressed state of the retractable unit. Assuming that the torsional spring constant of the elastic member installed at each joint is 'k', energy corresponding to 'k$\Delta\theta^2/2$' may be stored in each elastic member. Since the energy stored in each elastic member will increase in proportion to the number of stages formed by the links, the total energy stored in all elastic members of the retractable unit may be represented by the following Equation 6.

$$E_{spring} = f_2(n)k\frac{d_{in}^2}{2l^2} \quad \text{Equation 6}$$

Accordingly, the drive force F1 required for the driving of the retractable unit upon the upward movement of the flexible display module may be represented by the following Equation 7.

$$F_1 = nF_2 + \frac{c}{l}f_1(n) - f_2(n)k\frac{d_{in}}{2l^2} \quad \text{Equation 7}$$

According to Equation 7, it will be appreciated that, when setting a sufficiently great constant 'k$d_{in}/2l^2$', the drive force F1 required for the driving of the retractable unit upon the upward movement of the flexible display module may be efficiently reduced.

In conclusion, the present invention may reduce the load applied to the link elevating unit upon the upward movement of the flexible display module by unfolding the retractable unit using the compressive restoration force of the elastic members in addition to the drive force of the link elevating unit.

Figure 17A:
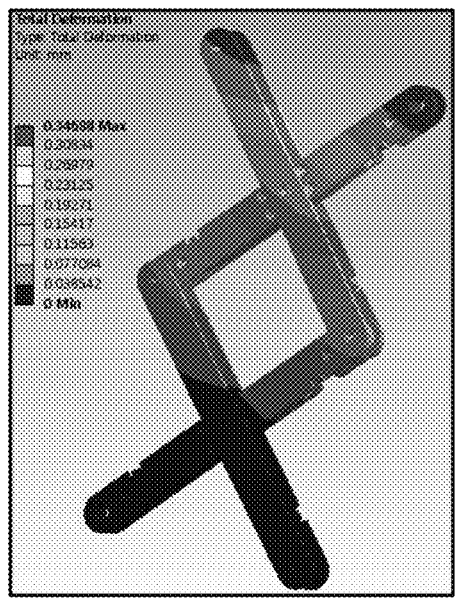
FIGS. 17A and 17B are views illustrating relative deformation amounts based on the upper end load test for retractable units of the present invention and a comparative example.
Figure 17B:
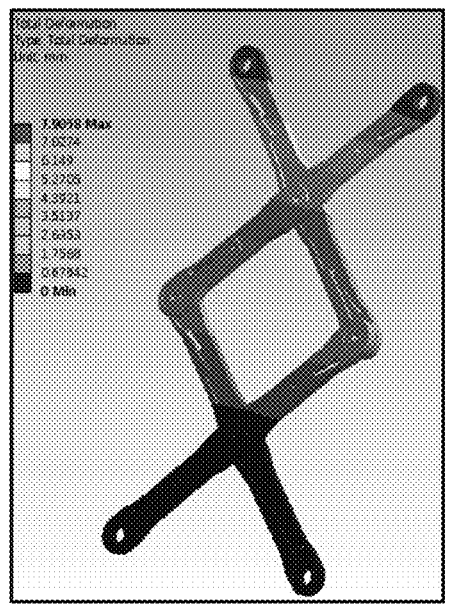

FIGS. 17A and 17B are views illustrating relative deformation amounts based on the upper end load test for retractable units of the present invention and a comparative example.

First, the retractable unit according to the present invention includes links each having two stainless link plates, and the retractable unit of the comparative example includes links each having a single aluminum link plate.

As will be appreciated from FIG. 17A, the retractable unit according to the present invention has a deformation amount of 0.3468 mm at the upper end when the lower end is stationary as the first and second links, each having two link plates formed of a higher strength stainless material, intersect each other. In contrast, as will be appreciated from FIG. 17B, the retractable unit of the comparative example has a deformation amount of 7.9058 mm at the upper end when the lower end is stationary as the first and second links, each having a single link plate formed of aluminum, intersect each other. Accordingly, it can be confirmed that the retractable unit according to the present invention has the deformation amount less than that of the comparative example.

Figure 18A:
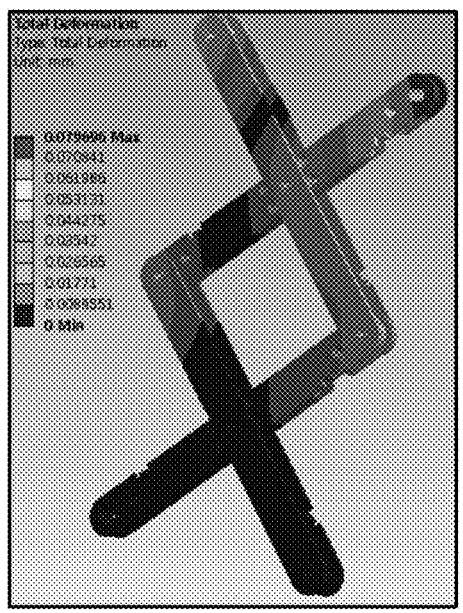
FIGS. 18A and 18B are views illustrating relative deformation amounts based on the upper end torsion test for retractable units of the present invention and a comparative example.
Figure 18B:
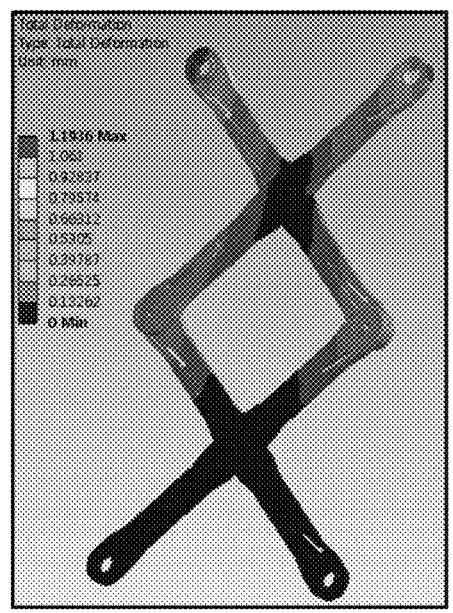

FIGS. 18A and 18B are views illustrating relative deformation amounts based on the upper end torsion test for retractable units of the present invention and a comparative example.

As will be appreciated from FIG. 18A, the retractable unit according to the present invention has a torsion amount of 0.0796 mm at the upper end when the lower end is stationary as the first and second links, each having two link plates formed of a higher strength stainless material, intersect each other. In contrast, as will be appreciated from FIG. 18B, the retractable unit of the comparative example has a torsion amount of 1.1936 mm at the upper end when the lower end is stationary as the first and second links, each having a single link plate formed of aluminum, intersect each other. Accordingly, it can be confirmed that the retractable unit according to the present invention has the torsion amount less than that of the comparative example.

In conclusion, the retractable unit according to the present invention has a relatively low deformation amount and torsional value and, therefore, may realize the stable vertical movement of a flexible display module and maintain the constant vertical flatness of a vertically upright flexible display module.

Although the flexible display apparatus according to the present invention has been described above as being a large flexible display apparatus, the present invention is not limited thereto and may be applied to all sizes of flexible display apparatuses.

As is apparent from the above description, the present invention has the following effects.

First, a flexible display module is wound or unwound as an upper portion of the flexible display module is vertically moved via driving of a panel elevating module, which may provide the flexible display module with a reduced thickness and ensure easy winding or unwinding of the flexible display module.

Second, a flexible rear cover supports the rear surface of an outwardly pulled flexible display panel to maintain the outwardly pulled flexible display panel in a planar state, which may improve the vertical flatness of the flexible display panel.

In addition to the effects of the present invention as mentioned above, other features and advantages of the present invention will be clearly understood by those skilled in the art from the above description.

The present invention as described above are not limited to the above-described embodiments and the accompanying drawings and those skilled in the art will clearly appreciate that various modifications, deformations, and substitutions are possible without departing from the scope and spirit of the invention. Hence, the scope of the present invention is defined by the claims as will be described below and all variations or alternations derived from the meanings and scope of the claims and equivalent concepts thereof should be construed as being included in the scope of the present invention.

What is claimed is:
1. A flexible display apparatus comprising:
a flexible display module;
a frame module connected to a lower side of the flexible display module, the flexible display module being configured to be wound onto the frame module or unwound from the frame module; and
a panel elevating module connected to an upper side of the flexible display module, the panel elevating module including at least one retractable unit configured to elevate the flexible display module via unfolding of the at least one retractable unit,
wherein the retractable unit includes:
a plurality of first links;
a plurality of second links intersecting respective ones of the first links;

a hinge member provided at each intersection between the first and second links;
a joint member provided at adjoining ends of each of the first and second links; and
an elastic member provided at each joint member and supported by the ends of the first and second links,
wherein the flexible display module includes:
a flexible display panel; and
a flexible rear cover coupled to an upper side of the flexible display panel to selectively support a rear surface of the flexible display panel, and
wherein the frame module includes:
a panel roller, the flexible display panel being configured to be wound around the panel roller or unwound from the panel roller; and
a cover roller, the flexible rear cover being wound around the cover roller or unwound from the cover roller via vertical movement of the panel elevating module.

2. The flexible display apparatus according to claim 1, wherein the elastic member is compressed when the flexible display module is moved downward; and
wherein the elastic member provides the respective first and second links with a restoration force when the flexible display module is moved upward.

3. The flexible display apparatus according to claim 2, wherein the panel elevating module further includes:
an upper frame coupled to the upper side of the flexible display module to support an upper side of the retractable unit;
a lower frame coupled to the frame module to support a lower side of the retractable unit; and
a link elevating unit coupled to the lower frame to fold and unfold the retractable unit.

4. The flexible display apparatus according to claim 1, wherein the elastic member includes:
a coil portion configured to surround the joint member;
a first elastic arm extending from one end of the coil portion and connected to the first link; and
a second elastic arm extending from the other end of the coil portion and connected to the second link.

5. The flexible display apparatus according to claim 1, wherein each second link extends through the corresponding first link.

6. The flexible display apparatus according to claim 1, wherein the elastic member includes:
a first torsion spring supported by first ends of the first and second links and surrounding the joint member at the first ends of the first and second links; and
a second torsion spring supported by the second ends of the first and second links and surrounding the joint member at the second ends of the first and second links.

7. The flexible display apparatus according to claim 1, wherein the frame module further includes first and second support frames configured to support the panel elevating module, and
wherein the panel roller is connected between the first and second support frames.

8. The flexible display apparatus according to claim 7, wherein the flexible display module further includes:
a module connection member connected to a lower side of the flexible display panel and coupled to the panel roller.

9. The flexible display apparatus according to claim 8, wherein the flexible rear cover is coupled to the upper side of the retractable unit, and wherein the cover roller is connected between the first and second support frames.

10. The flexible display apparatus according to claim 9, wherein the flexible rear cover includes a plurality of support bars rotatably connected to one another.

11. The flexible display apparatus according to claim 9, wherein the flexible rear cover includes:
a plurality of first support bars having a first length;
a plurality of second support bars having a second length shorter than the first length, the second support bars being rotatably connected between the respective first support bars; and
side surface protective covers provided respectively at both sides of the first support bars protruding in a lateral direction of the second support bars.

12. The flexible display apparatus according to claim 9, wherein the flexible display module further includes a panel attachment member configured to selectively attach a portion of the flexible rear cover to the rear surface of the flexible display panel using magnetic force.

13. The flexible display apparatus according to claim 9, wherein the flexible display module further includes a rear curtain coupled to an upper side of a rear surface of the panel elevating module to cover the rear surface of the panel elevating module, and
wherein the frame module includes a rear curtain roller connected between the first and second support frames, the rear curtain being wound around the rear curtain roller or unwound from the rear curtain roller via vertical movement of the panel elevating module.

14. The flexible display apparatus according to claim 9, further comprising:
an upper portion cover configured to cover upper edge portions of the flexible display module and the panel elevating module; and
side curtain units provided to the upper portion cover to cover both side surfaces of each of the panel elevating module and the flexible display module.

15. The flexible display apparatus according to claim 14, wherein each of the side curtain units includes:
a first side curtain roller provided at one side of the upper portion cover;
a second side curtain roller provided to the other side of the upper portion cover;
a first side curtain coupled between the first side curtain roller and the frame module to cover a first side surface of each of the panel elevating module and the flexible display module by being unwound from the first side curtain roller when the flexible display module is moved upward; and
a second side curtain coupled between the second side curtain roller and the frame module to cover a second side surface of each of the panel elevating module and the flexible display module by being unwound from the second side curtain roller when the flexible display module is moved upward.

16. A flexible display apparatus comprising:
a flexible display module;
a frame module connected to a lower side of the flexible display module, the flexible display module being configured to be wound onto the frame module or unwound from the frame module; and
a panel elevating module connected to an upper side of the flexible display module, the panel elevating module including at least one retractable unit configured to elevate the flexible display module via unfolding of the at least one retractable unit, wherein the retractable unit includes:
  a plurality of first links;
  a plurality of second links intersecting respective ones of the first links;
  a hinge member provided at each intersection between the first and second links;
  a joint member provided at adjoining ends of each of the first and second links; and
  an elastic member provided at each joint member and supported by the ends of the first and second links,
wherein the elastic member is compressed when the flexible display module is moved downward,
wherein the elastic member provides the respective first and second links with a restoration force when the flexible display module is moved upward,
wherein the panel elevating module further includes:
  an upper frame coupled to the upper side of the flexible display module to support an upper side of the retractable unit;
  a lower frame coupled to the frame module to support a lower side of the retractable unit; and
  a link elevating unit coupled to the lower frame to fold and unfold the retractable unit, and
wherein the link elevating unit includes a cylinder member having an elevating shaft connected to the hinge member located adjacent to the lower frame.

17. A flexible display apparatus comprising:
a flexible display module;
a frame module connected to a lower side of the flexible display module, the flexible display module being configured to be wound onto the frame module or unwound from the frame module; and
a panel elevating module connected to an upper side of the flexible display module, the panel elevating module including at least one retractable unit configured to elevate the flexible display module via unfolding of the at least one retractable unit,
wherein the retractable unit includes:
  a plurality of first links;
  a plurality of second links intersecting respective ones of the first links;
  a hinge member provided at each intersection between the first and second links;
  a joint member provided at adjoining ends of each of the first and second links; and
  an elastic member provided at each joint member and supported by the ends of the first and second links,
wherein the elastic member is compressed when the flexible display module is moved downward,
wherein the elastic member provides the respective first and second links with a restoration force when the flexible display module is moved upward,
wherein the panel elevating module further includes:
  an upper frame coupled to the upper side of the flexible display module to support an upper side of the retractable unit;
  a lower frame coupled to the frame module to support a lower side of the retractable unit; and
  a link elevating unit coupled to the lower frame to fold and unfold the retractable unit,
wherein the at least one retractable unit comprises a pair of retractable units installed in parallel with each other between the upper frame and the lower frame, and
wherein the link elevating unit includes:
  an elevating plate connected between the pair of retractable units; and
  a gear assembly configured to elevate the elevating plate, the gear assembly including a plurality of gears and a rotation motor for driving the gears.

18. The flexible display apparatus according to claim 17, wherein the link elevating unit further includes:
  a pair of support brackets coupled to the lower frame to support lowermost hinge members of the respective retractable units; and
  an elevating guide member coupled to the lower frame to guide vertical movement of the elevating plate, and
  wherein the elevating plate is connected to hinge members of the respective retractable units adjacent to the lowermost hinge members.

19. A flexible display apparatus comprising:
a flexible display module;
a frame module connected to a lower side of the flexible display module, the flexible display module being configured to be wound onto the frame module or unwound from the frame module; and
a panel elevating module connected to an upper side of the flexible display module, the panel elevating module including at least one retractable unit configured to elevate the flexible display module via unfolding of the at least one retractable unit,
wherein the retractable unit includes:
  a plurality of first links;
  a plurality of second links intersecting respective ones of the first links;
  a hinge member provided at each intersection between the first and second links;
  a joint member provided at adjoining ends of each of the first and second links; and
  an elastic member provided at each joint member and supported by the ends of the first and second links,
wherein the elastic member includes:
  a first torsion spring supported by first ends of the first and second links and surrounding the joint member at the first ends of the first and second links; and
  a second torsion spring supported by the second ends of the first and second links and surrounding the joint member at the second ends of the first and second links, and
wherein the first link includes:
  a first link plate;
  a second link plate extending parallel to the first link plate with a gap space interposed between the first link plate and the second link plate;
  a first stopper provided at a top side of the first link plate to fix a first end of the first torsion spring; and
  a second stopper provided at a bottom side of the first link plate to fix a first end of the second torsion spring.

20. The flexible display apparatus according to claim 19, wherein the second link includes:
  a third link plate;
  a fourth link plate extending parallel to the third link plate, the third and fourth link plates being rotatable between the first and second link plates about the hinge member serving as a rotation axis;
  a third stopper provided at a bottom side of the fourth link plate to fix a second end of the first torsion spring; and
  a fourth stopper provided at a top side of the fourth link plate to fix a second end of the second torsion spring.

21. The flexible display apparatus according to claim 20, wherein the second link further includes a reinforcement member connected between the third and fourth link plates.

22. The flexible display apparatus according to claim 21, wherein the reinforcement member comprises a metal material having a smaller strength than that of the respective third and fourth link plates.

* * * * *